United States Patent
Kawamura et al.

(10) Patent No.: US 8,314,032 B2
(45) Date of Patent: Nov. 20, 2012

(54) SEMICONDUCTOR DEVICE AND METHOD FOR MANUFACTURING THE SAME

(75) Inventors: Tetsufumi Kawamura, Kodaira (JP); Hiroyuki Uchiyama, Musashimurayama (JP); Hironori Wakana, Tokorozawa (JP); Mutsuko Hatano, Kokubunji (JP); Takeshi Sato, Mobara (JP)

(73) Assignee: Hitachi, Ltd., Tokyo (JP)

( * ) Notice: Subject to any disclaimer, the term of this patent is extended or adjusted under 35 U.S.C. 154(b) by 179 days.

(21) Appl. No.: 12/838,451

(22) Filed: Jul. 17, 2010

(65) Prior Publication Data

US 2011/0042667 A1    Feb. 24, 2011

(30) Foreign Application Priority Data

Aug. 21, 2009  (JP) ................................. 2009-191589

(51) Int. Cl.
   *H01L 21/311* (2006.01)
(52) U.S. Cl. ........... 438/700; 438/299; 438/708; 257/47
(58) Field of Classification Search .................. 438/299, 438/700, 708; 257/47
   See application file for complete search history.

(56) References Cited

U.S. PATENT DOCUMENTS

| | | | |
|---|---|---|---|
| 5,264,383 A | | 11/1993 | Young |
| 5,441,905 A | * | 8/1995 | Wu ................................ 438/160 |
| 5,888,855 A | * | 3/1999 | Nagahisa et al. ............. 438/158 |
| 6,380,009 B1 | * | 4/2002 | Battersby ...................... 438/161 |
| 6,403,408 B1 | * | 6/2002 | Green et al. ................... 438/161 |
| 6,495,386 B2 | * | 12/2002 | Powell ............................ 438/48 |
| 6,559,905 B1 | * | 5/2003 | Akiyama ........................ 349/45 |
| 6,872,977 B2 | * | 3/2005 | Hatano et al. ................... 257/64 |
| 7,211,825 B2 | * | 5/2007 | Shih et al ........................ 257/72 |
| 7,872,263 B2 | * | 1/2011 | Huang et al. ................... 257/66 |
| 7,968,368 B2 | * | 6/2011 | Wakana et al. ............... 438/104 |

FOREIGN PATENT DOCUMENTS

| | | |
|---|---|---|
| JP | 62-152174 A | 7/1987 |
| JP | 5-190568 A | 7/1993 |
| JP | 6-333949 A | 12/1994 |
| JP | 7-211914 A | 8/1995 |
| JP | 2009-141001 A | 6/2009 |
| WO | WO 2009/072533 A1 | 6/2009 |

* cited by examiner

*Primary Examiner* — Jarrett Stark
*Assistant Examiner* — Nicholas Tobergte
(74) *Attorney, Agent, or Firm* — Miles & Stockbridge P.C.

(57) ABSTRACT

A method for manufacturing a thin film transistor (TFT) through a process including back exposure, in which oxide semiconductor is used for a channel layer; using an electrode over a substrate as a mask, negative resist is exposed to light from the back of the substrate; the negative resist except its exposed part is removed; and an electrode is shaped by etching a conductive film using the exposed part as an etching mask.

17 Claims, 26 Drawing Sheets

(a)

A-A'

(b)

B-B'

(c)

(a-1)

(b-1)

(a-2)

(b-2)

(a-3)

(b-3)

(a-4)

(b-4)

(a-5)

(b-5)

(a-6)

(b-6)

(a-7)

(b-7)

(a)

(b)

(c)

(d)

(a)

A-A'

(b)

B-B'

(c)

(a-5)

(b-5)

(a-6)

(b-6)

(a-7)

(b-7)

(a)

A-A'

(b)

B-B'

(c)

(a)

A-A'
(b)

B-B'
(c)

(a)

(b)

(c)

(d)

(a)

(b)

(c)

(d)

(a)

(b)

(a)

(b)

(c)

(d)

(a)

(b)

(a)

(b)

(c)

(d)

(a)

(b)

(a)

(b)

(c)

(d)

US 8,314,032 B2

SEMICONDUCTOR DEVICE AND METHOD FOR MANUFACTURING THE SAME

CLAIM OF PRIORITY

The present application claims priority from Japanese patent application JP 2009-191589 filed on Aug. 21, 2009, the content of which is hereby incorporated by reference into this application.

FIELD OF THE INVENTION

The present invention relates to semiconductor devices and more particularly to semiconductor devices which include a field-effect transistor using a metal oxide film as a channel layer.

BACKGROUND OF THE INVENTION

A thin film transistor (hereinafter sometimes referred to as TFT), which can be formed on a substrate of an insulating material such as glass, is an important device in electronics technology.

As materials for channel layers in TFTs, amorphous silicon and polycrystalline silicon are now most widely used. In recent years, metal oxide semiconductors have been attracting attention as TFT channel layer materials which substitute for these silicon materials and research and development on such semiconductors are being carried out actively. Metal oxide semiconductors not only provide excellent features as channel layer materials but also are characterized in that they can be formed around room temperature. For this reason, they are considered as major candidates for the channel layer material for formation of a TFT on a flexible substrate like a plastic film.

SUMMARY OF THE INVENTION

In case of an oxide semiconductor device as described in JP-A-2009-141001, it is difficult to form a diffusion layer by ion implantation, so a self-alignment process using ion implantation cannot be realized as in case of bulk silicon MOS transistors or polycrystalline silicon TFTs. Therefore, an overlap often occurs between the gate electrode and source/drain electrode, resulting in a parasitic capacitance. Since this parasitic capacitance is a major factor which hampers the speeding-up of the circuit formed with the TFT, it should be minimized. In particular, when a TFT is to be formed on a flexible substrate like a plastic film, the amount of overlap may be very large because a large layout margin is required in anticipation of contraction/expansion of the substrate.

A method for reducing the parasitic capacitance caused by an overlap has been proposed in which an oxide TFT is produced in a self-aligned manner by a process which combines back exposure and a lift-off technique. However, this method has a drawback that the yield may deteriorate due to a missing pattern or residues generated during the lift-off process.

An object of the present invention is to provide a self-alignment process for oxide semiconductors in which the above problem does not arise in a lift-off process Various methods for manufacturing a silicon semiconductor TFT by a process combining back exposure and etching are disclosed in JP-A-Sho62 (1987)-152174, JP-A-Hei5 (1993)-190568, JP-A-Hei6 (1994)-333949, and JP-A-Hei7 (1995)-211914. In the techniques described in these patent documents, amorphous silicon or polysilicon is used for the channel layer in a TFT. The band gap of amorphous silicon or polysilicon is as small as approximately 1 eV (wavelength 1240 nm), which means that most of light of wavelengths below 400 nm is absorbed. Therefore, there is difficulty in using light of a shorter wavelength for back exposure of resist. As a consequence, it is impossible to use i rays of a mercury lamp (wavelength 365 nm) which are commonly used. Furthermore, reduction in TFT size is difficult.

According to the diagram of wavelength dependency of light absorbance of amorphous silicon as shown in JP-A-Hei7 (1995)-211914, even when the band gap was increased by addition of carbon, most of light of wavelengths below 400 nm was absorbed.

In the techniques described in JP-A-Hei5 (1993)-190568 and JP-A-Hei6 (1994)-333949, an $n^+$ silicon layer is required in order to connect the silicon layer for the TFT channel with the metal layer. This means the need for a step of forming an $n^+$ silicon layer.

Furthermore, since the production of a silicon TFT requires a high-temperature process, a flexible substrate like a plastic film is not suitable for the production of a silicon TFT. A metal oxide semiconductor not only provides excellent features as a material for a channel layer but also can be formed around room temperature. For this reason, it is considered as one of the major candidates for the material of the channel layer in a TFT formed on a flexible substrate like a plastic film.

A typical aspect of the invention which is disclosed herein is briefly summarized below.

A TFT is manufactured by a process including back exposure as follows: oxide semiconductor is used for a channel layer; using an electrode on a substrate as a mask, negative resist is exposed to light from the back of the substrate; the negative resist except its exposed part is removed; and an electrode is shaped by etching a conductive film using the exposed part as an etching mask.

The advantageous effects achieved by the preferred embodiments of the present invention as disclosed herein are briefly summarized below.

According to the invention, a self-alignment process in which the problem inherent in a lift-off process does not occur can be achieved for oxide semiconductor. In the manufacture of a TFT by back exposure, shorter wavelengths of light can be used for back exposure of resist. In addition, it is possible to manufacture a high speed TFT in which the resistance of its source and drain electrodes is sufficiently low. Furthermore, the parasitic capacitance of an oxide semiconductor TFT can be reduced.

BRIEF DESCRIPTION OF THE DRAWINGS

FIGS. 2A to 2C show the structure of a semiconductor device according to a first embodiment of the invention, in which FIG. 2A is a plan view, FIG. 2B is a sectional view taken along the line A-A' and FIG. 2C is a sectional view taken along the line B-B';

FIG. 4B shows a gate electrode shape, FIG. 4C shows a second gate electrode shape and FIG. 4D shows a third gate electrode shape;

FIGS. 6A to 6C show the structure of a semiconductor device according to the first embodiment, in which FIG. 6A is a plan view, FIG. 6B is a sectional view taken along the line A-A and FIG. 6C is a sectional view taken along the line B-B';

FIGS. 8A to 8C show the structure of a semiconductor device according to the first embodiment, in which FIG. 8A is a plan view, FIG. 8B is a sectional view taken along the line A-A, and FIG. 8C is a sectional view taken along the line B-B';

FIGS. 9A to 9C show the structure of a semiconductor device according to the first embodiment, in which FIG. 9A is a plan view, FIG. 9B is a sectional view taken along the line A-A, and FIG. 9C is a sectional view taken along the line B-B';

FIGS. 11A to 11D are sectional views showing the structure of a semiconductor device according to a second embodiment of the invention and a method for manufacturing the same, in which FIG. 11A shows a step in the method, FIG. 11B shows a second step, FIG. 11C shows a third step and FIG. 11D shows a fourth step;

FIGS. 12A to 12D are sectional views showing the structure of a semiconductor device according to a third embodiment of the invention and a method for manufacturing the same, in which FIG. 12A shows a step in the method, FIG. 12B shows a second step, FIG. 12C shows a third step and FIG. 12D shows a fourth step;

FIGS. 13A and 13B are plan views showing the structure of a semiconductor device according to the third embodiment and a method for manufacturing the same, in which FIG. 13A shows the transparent conductive layer shown in FIG. 12D and FIG. 13B shows the gate electrode and the source electrode and drain electrode formed from the transparent conductive layer;

FIGS. 14A to 14D show the structure of a semiconductor device according to the third embodiment, in which FIG. 14A is a plan view of an arrangement of electrodes and interconnects, FIG. 14B is a sectional view taken along the line B-B' in FIG. 14A, FIG. 14C is a plan view of another example of the conductive layer arrangement, and FIG. 14D is a plan view of a further example of the conductive layer arrangement;

FIGS. 15A and 15B show the structure of a semiconductor device according to the third embodiment and a method for manufacturing the same, in which FIG. 15A is a plan view and FIG. 15B is a sectional view;

FIGS. 17A to 17E are sectional views showing the structure of a semiconductor device according to a fourth embodiment of the invention and a method for manufacturing the same, in which FIG. 17A shows a step in the method, FIG. 17B shows a second step, FIG. 17C shows a third step, FIG. 17D shows a fourth step, and FIG. 17E shows a fifth step;

FIGS. 18A to 18D are sectional views showing the structure of a semiconductor device according to a fifth embodiment of the invention and a method for manufacturing the same, in which FIG. 18A shows a step in the method, FIG. 18B shows a second step, FIG. 18C shows a third step, and FIG. 18D shows a fourth step;

FIGS. 19A and 19B show the structure of a semiconductor device according to the fifth embodiment, in which FIG. 19A is a plan view and FIG. 19B is a sectional view;

FIGS. 20A to 20D are sectional views showing the structure of a semiconductor device according to a sixth embodiment of the invention and a method for manufacturing the same, in which FIG. 20A shows a step in the method, FIG. 20B shows a second step, FIG. 20C shows a third step, and FIG. 20D shows a fourth step;

DETAILED DESCRIPTION OF THE PREFERRED EMBODIMENTS

First Embodiment

Figure 2:
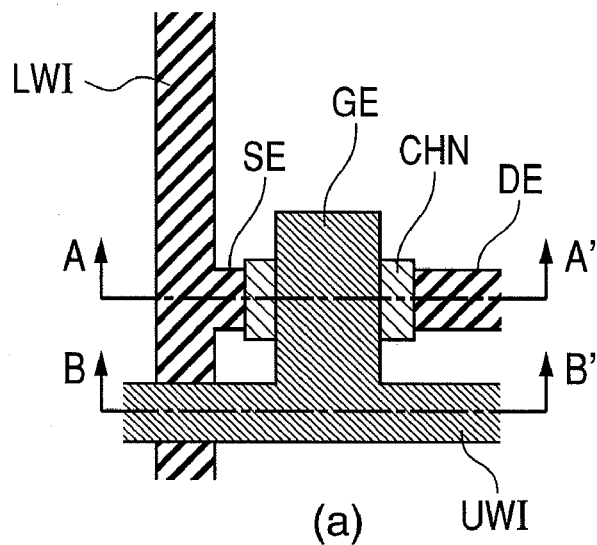
Figure 2:
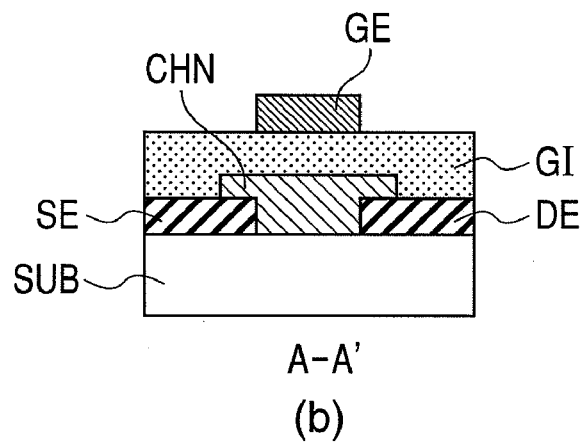
Figure 2:
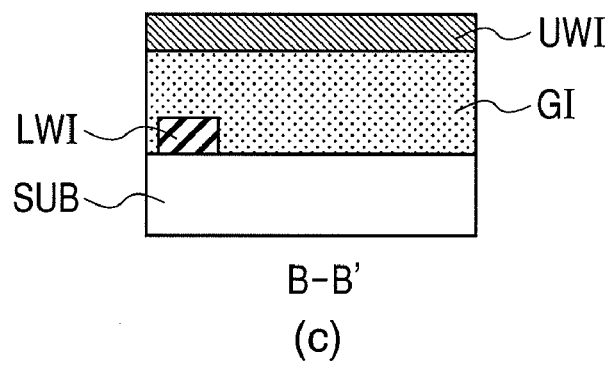

FIGS. 2A to 2C show a top-gate bottom-contact TFT which uses an oxide semiconductor. Here, "top-gate" means that a gate electrode GE is formed in a layer above a channel layer CHN, and "bottom-contact" means that a source electrode SE and a drain electrode DE are formed in a layer below the channel layer CHN.

FIG. 2A is a top view of the TFT; FIG. 2B is a sectional view taken along the line A-A' in FIG. 2A; and FIG. 2C is a sectional view taken along the line B-B' in FIG. 2A.

As illustrated in FIG. 2A, the semiconductor device includes a source electrode SE, drain electrode DE, gate electrode GE, and channel layer CHN. The source electrode SE is connected with a lower wire interconnect LW1. The gate electrode GE is connected with an upper wire interconnect UWI.

As illustrated in FIG. 2B, the source electrode SE and drain electrode DE are formed over a substrate SUB. The channel layer CHN lies between and over the source electrode SE and drain electrode DE. A gate insulating film GI is formed over the source electrode SE, drain electrode DE, and channel layer CHN. The gate electrode GE is formed over the gate insulating film GI.

As illustrated in FIG. 2C, the lower wire interconnect LWI is formed over the substrate SUB. The lower wire interconnect LWI lies in the same layer as the source electrode SE and drain electrode DE. The upper wire interconnect UWI is formed above the lower wire interconnect LWI through the gate insulating film GI. The upper wire interconnect UWI lies in the same layer as the gate electrode DE.

The oxide semiconductor which constitutes the semiconductor channel layer CHN is low in contact resistance with metal, so the semiconductor channel layer CHN can be connected directly with the metal film which constitutes the source electrode SE and drain electrode DE. Therefore, high-concentration impurity layers n+ and p+ which would be needed for junction between silicon and metal are not needed. Consequently the structure of the TFT is simpler.

Here, the transparent substrate SUB may be glass, quartz, or plastic film and, when necessary, it has an insulating film coating on its surface where the source electrode SE and drain electrode DE are formed.

The source electrode SE and drain electrode DE are made of a material opaque with respect to light used for back exposure. For example, they are formed as: a single film of molybdenum, chrome, tungsten, aluminum, copper, titanium, nickel, tantalum, Silver, zinc, or other metal; an alloy film or laminate film which combines any of these metals; a laminate film which combines a metal oxide conductive film like ITO (In—Sn—O: indium tin oxide) and a metal; a laminate film which combines a metal nitride conductive film like titanium nitride (Ti—N) and a metal; a laminate film which combines another conductive metal compound film and a metal; a highly doped semiconductor; or a laminate film which combines a doped semiconductor and a metal.

It is preferable to use an oxide such as Si—O or Al—O for the gate insulating film GI, but it may be an insulating film of a non-oxide material such as Si—N.

For example, the channel layer CHN is made of Zn, In, Ga or Sn oxide such as Zn—O, In—O, Ga—O, Sn—O, In—Ga—Zn—O, Zn—Sn—O, In—Sn—O, In—Zn—O, Ga—Zn—O, or In—Ga—O, or a composite oxide as a combination of these.

For example, the gate electrode GE is made as a transparent conductive film of ITO (In—Sn—O), Al—Zn—O or Sn—O, or made of the same material as used for the channel layer CHN, the conductivity of which is increased.

Figure 3A:
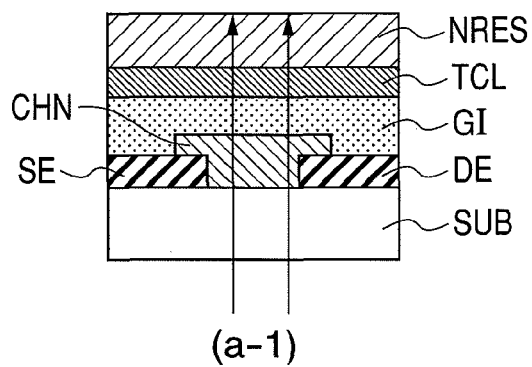
FIG. 3A shows steps (a-1)/(b-1) to (a-3)/(b-3) in the manufacturing method for the semiconductor device shown in FIGS. 2A to 2C.
Figure 3A:
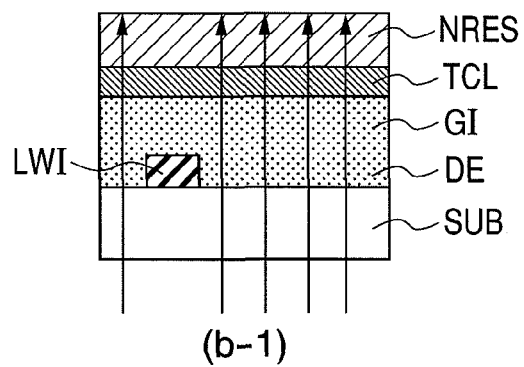
Figure 3A:
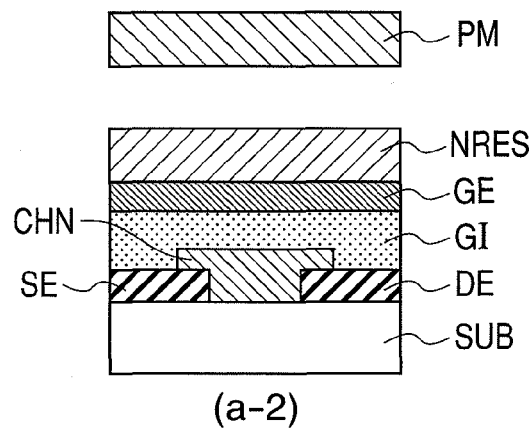
Figure 3A:
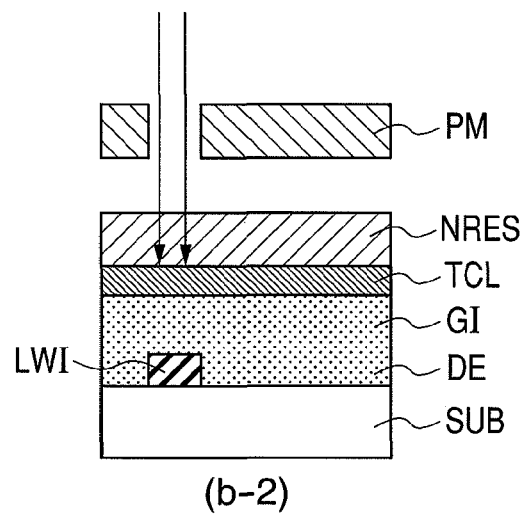
Figure 3A:
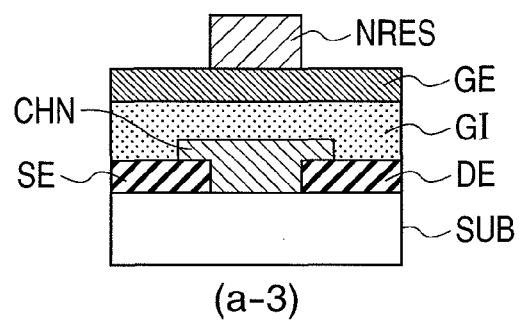
Figure 3A:
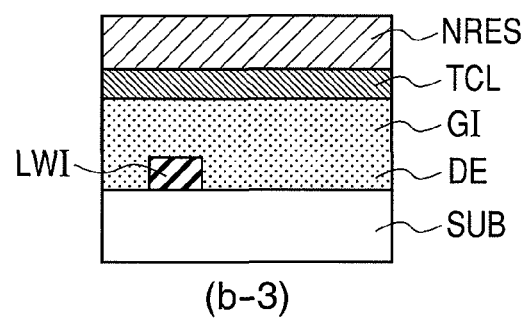
Figure 3B:
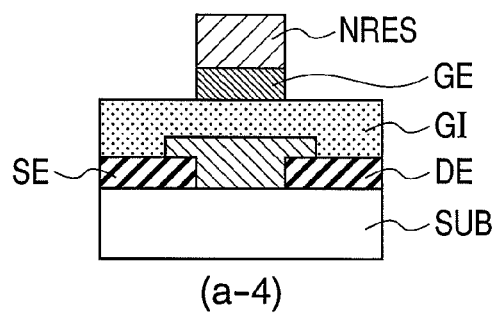
FIG. 3B shows steps (a-4)/(b-4) to (a-7)/(b-7) in the manufacturing method for the semiconductor device shown in FIGS. 2A to 2C.
Figure 3B:
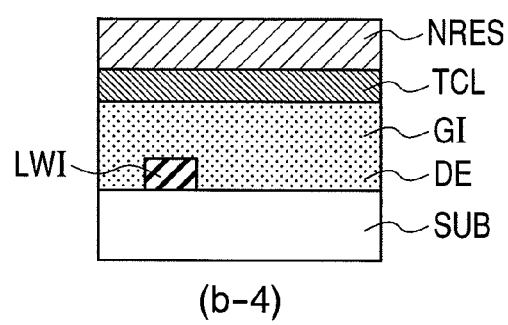
Figure 3B:
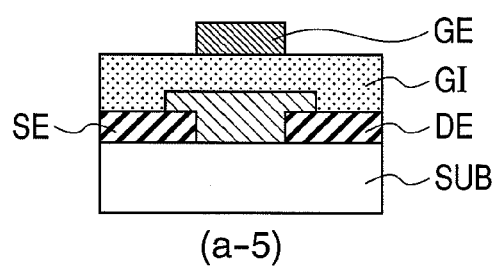
Figure 3B:
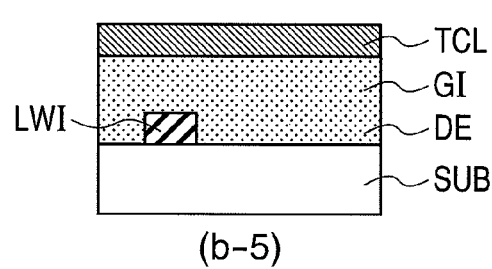
Figure 3B:
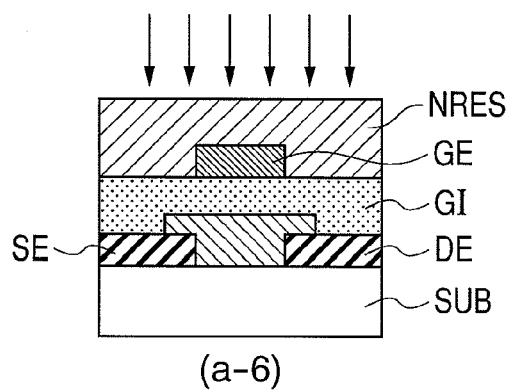
Figure 3B:
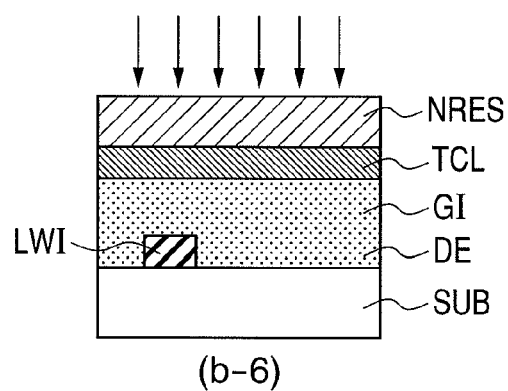
Figure 3B:
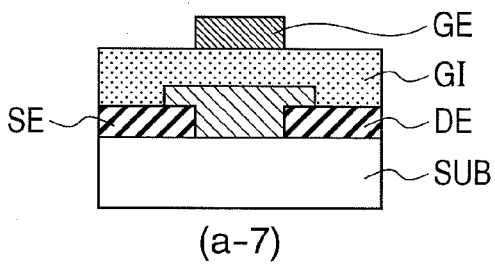
Figure 3B:
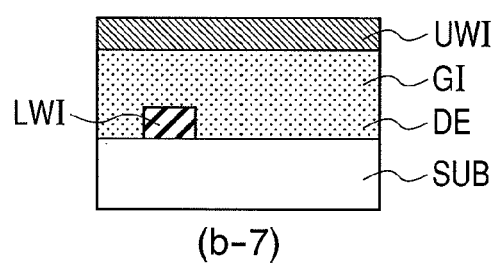

FIGS. 3A and 3B show steps for manufacturing the TFT shown in FIGS. 2A to 2C. (a-1) to (a-7) illustrate cross sections of the manufacturing steps, taken along the line A-A' in FIG. 2A and (b-1) to (b-7) illustrate cross sections of the manufacturing steps, taken along the line B-B' in FIG. 2A. (a-1) and (b-1) illustrate a manufacturing step; (a-2) and (b-2) illustrate a manufacturing step; (a-3) and (b-3) illustrate a manufacturing step; (a-4) and (b-4) illustrate a manufacturing step; (a-5) and (b-5) illustrate a manufacturing step; (a-6) and (b-6) illustrate a manufacturing step; and (a-7) and (b-7) illustrate a manufacturing step.

First, in the step illustrated in (a-1) and (b-1), the source electrode SE and drain electrode DE are formed from metal over the transparent substrate SUB with a given distance or spacing region between them. In this process, the lower wire interconnect LWI is also formed. A CVD or sputtering technique is used to make a metal film and an ordinary photolithographic technique and dry etching are combined to shape the source electrode SE and drain electrode DE.

The word "transparent" used in the term "transparent substrate SUB", etc. means that the substrate can transmit light from a mercury lamp (i rays, 365 nm, etc.) to some extent in the step of back exposure (stated later) but does not mean that it always looks transparent when seen with the naked eye.

Then, a semiconductor channel layer CHN is formed in a way to straddle the source electrode SE and drain electrode DE. Sputtering or a similar technique is used to make an oxide semiconductor film and an ordinary photolithographic technique and wet or dry etching are combined to shape it into the channel layer CHN.

Next, a gate insulating film GI is formed in a way to cover the source electrode SE, drain electrode DE, semiconductor channel layer CHN, and lower wire interconnect LWI. CVD or sputtering is used to make this gate insulating film GI.

Then, a transparent conductive layer TCL is formed over the gate insulating film GI by sputtering or a similar technique and it is coated with negative resist NRES and the negative resist NRES is exposed to light from the back of the transparent substrate SUB (back exposure). In this exposure step, the source electrode SE and drain electrode DE, both made of metal, function as a mask and unmasked parts transmit exposure light so that the negative resist NRES is exposed in a self-aligned manner with respect to the source electrode SE and drain electrode DE. The oxide semiconductor can transmit light of wavelengths between approx. 250 nm and 2000 nm and, for example, its transmittance for light of a wavelength of 365 nm is approx. 75%. For this reason, short-wavelength light like i rays (365 nm) of a mercury lamp can be used for this back exposure.

Next, in the step illustrated in (a-2) and (b-2), the negative resist NRES in the area of intersection of the lower wire interconnect LWI and the upper wire interconnect UWI in the transparent conductive layer TCL is exposed to light from the front side using a photo mask PM (front exposure). This prevents the upper wire interconnect UWI from being divided. This front exposure may be made before or after back exposure or may be made simultaneously with back exposure.

Next, in the step illustrated in (a-3) and (b-3), the unexposed part of the negative resist NRES is removed to make a negative resist pattern.

Next, in the step illustrated in (a-4) and (b-4), the transparent conductive layer TCL is etched using the exposed part of the negative resist NRES as an etching mask. Consequently the gate electrode GE is formed in the channel direction.

Next, in the step illustrated in (a-5) and (b-5), the exposed part of the negative resist NRES is also removed.

Next, in the step illustrated in (a-6) and (b-6), in order to form the upper wire interconnect UWI from the transparent conductive layer. TCL, the transparent conductive layer TCL is shaped into the gate electrode GE and upper wire interconnect UWI using an ordinary photolithographic technique and wet or dry etching. Although (a-6) and (b-6) illustrate a case that negative resist NRES is used, it is needless to say that positive resist may be used instead. In the latter case, the photo mask used in the step illustrated in (a-6) and (b-6) is negative-positive reversed.

In the process shown in FIGS. 3A and 3B, the step of (a-1) for self-aligned processing including back exposure is first carried out and then the step for ordinary photolithographic processing is carried out. However, this order may be reversed.

Finally, in the step illustrated in (a-7) and (b-7), the TFT and the lower wire interconnect LWI and upper wire interconnect UWI are completed.

Since the above process does not require high temperature processing, the TFT can be easily formed on a flexible substrate like a plastic film.

Figure 4:
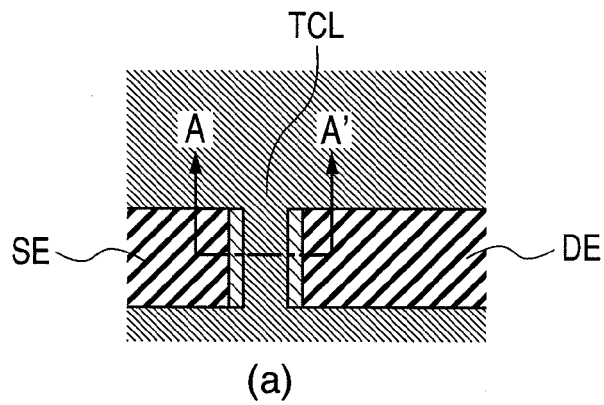
FIGS. 4A to 4D show the gate electrode and its vicinity in the TFT shown in FIGS. 2A to 2C, in which FIG. 4A corresponds to (a-5) and (b-5) in FIG. 3B.
Figure 4:
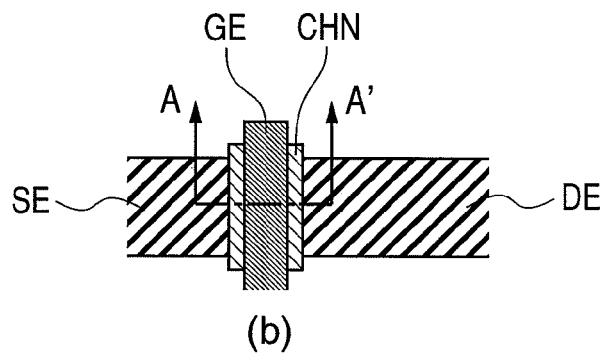
Figure 4:
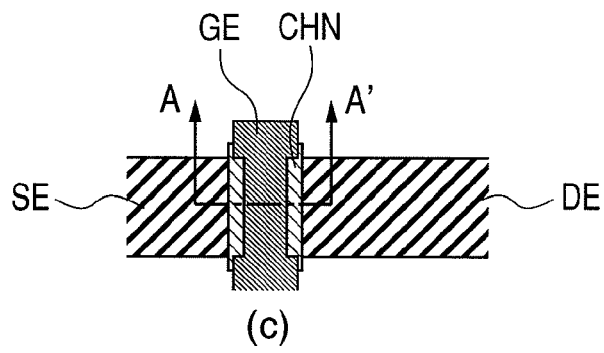
Figure 4:
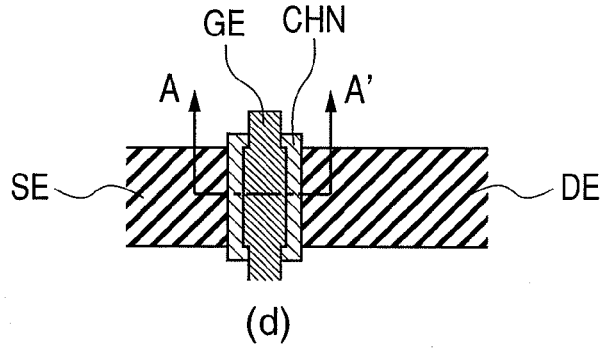

FIGS. 4A to 4D show the gate electrode and its vicinity in the TFT shown in FIGS. 2A to 2C. FIG. 4A shows the shape of the transparent conductive layer TCL illustrated in (a-5) and (b-5) of FIG. 3B. FIGS. 4B to 4D show the gate electrode GE formed through the step illustrated in (a-6) and (b-6) of FIG. 3B.

Since exposure of the resist cannot be made in a self-aligned manner in the step illustrated in (a-6) and (b-6), the shape of the gate electrode GE is not exactly the shape shown in FIG. 4B, but it will be an irregular shape as shown in FIG. 4C or 4D.

Figure 5:
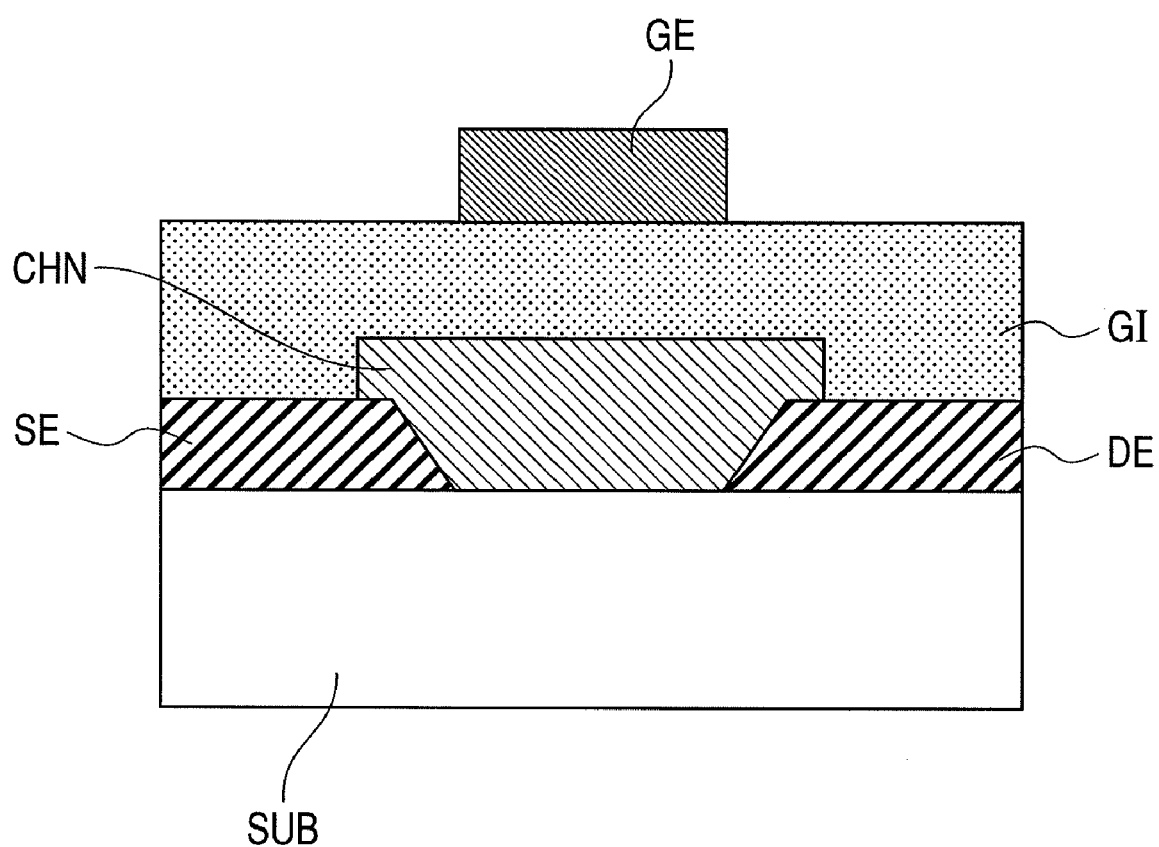
FIG. 5 is a sectional view of a semiconductor device according to the first embodiment.

FIG. 5 shows a TFT in which wet etching is done on metal in the step of (a-1) of FIG. 3A to form the source electrode SE and drain electrode DE. FIGS. 2A to 2C show a case that the source electrode SE and drain electrode DE have virtually vertical ends on the spacing region side since they are formed by dry etching. On the other hand, when wet etching is adopted, the spacing region side end of the source electrode SE and that of the drain electrode DE are tapered with the height decreasing toward the bottom of each end.

While the dry etching process is advantageous in that the processing accuracy is improved, the wet etching process is advantageous in that the channel layer CHN better covers the source electrode SE and drain electrode DE.

Figure 6:
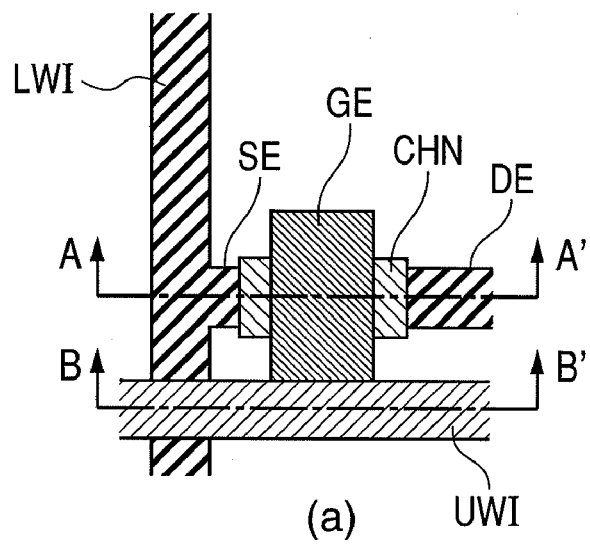
Figure 6:
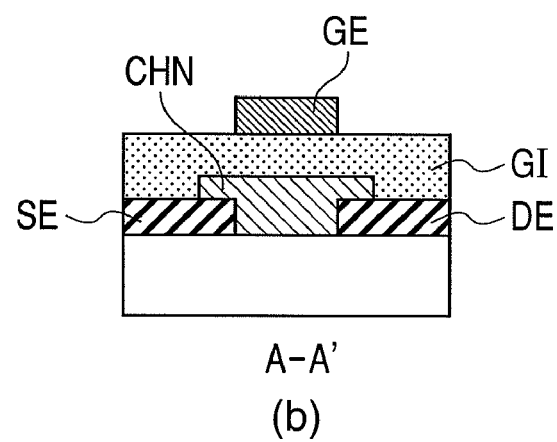
Figure 6:
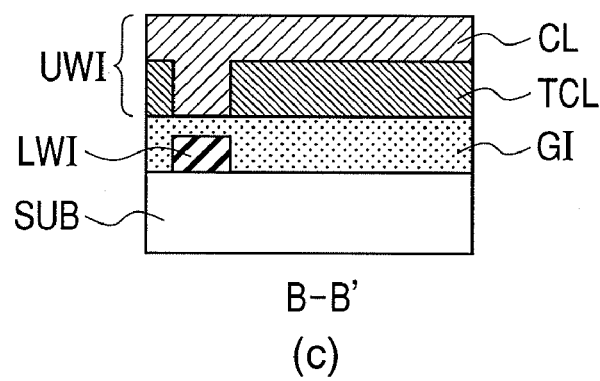

FIGS. 6A to 6C show a top-gate bottom-contact TFT which uses an oxide semiconductor. FIG. 6A is a top view of the TFT. FIG. 6B is a sectional view taken along the line A-A' in FIG. 6A. FIG. 6C is a sectional view taken along the line B-B' in FIG. 6A. FIGS. 6A to 6C are different from FIGS. 2A to 2C in that a conductive layer CL is formed over the transparent conductive layer TCL. In the TFT shown in FIGS. 6A to 6C, the upper wire interconnect UWI is a double-layer structure comprised of the transparent conductive layer TCL and conductive layer CL and thus provides higher conductivity.

FIG. 6A is the same as FIG. 2A except that the conductive layer CL lies over the transparent conductive layer TCL, so description thereof is omitted. FIG. 6B is the same as FIG. 2B, so description thereof is omitted.

As shown in FIG. 6C, the lower wire interconnect LWI is formed over the substrate SUB. The lower wire interconnect LWI lies in the same layer as the source electrode SE and drain electrode DE. The upper wire interconnect UWI is formed above the lower wire interconnect LWI through the gate insulating film GI. The upper wire interconnect UWI lies in the same layer as the gate electrode DE.

Figure 7A:
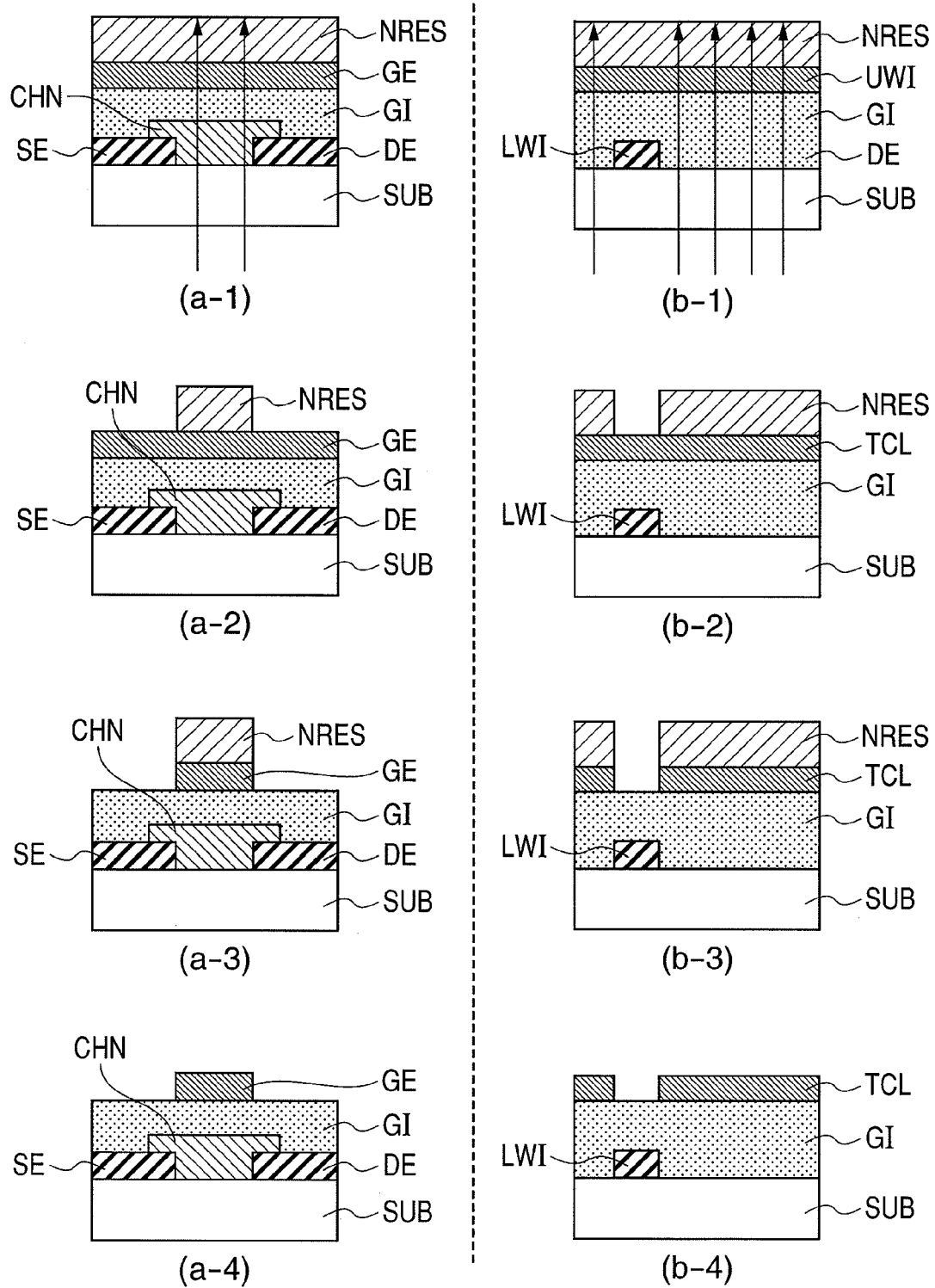
FIG. 7A shows steps (a-1)/(b-1) to (a-4)/(b-4) in the manufacturing method for the semiconductor device shown in FIGS. 6A to 6C.
Figure 7B:
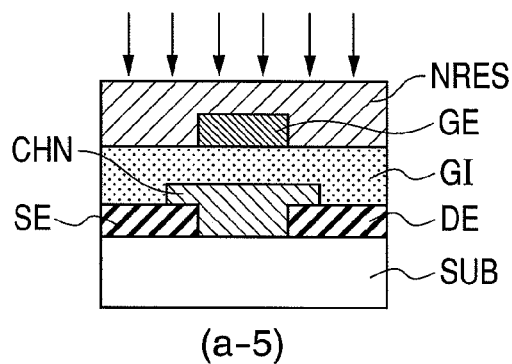
FIG. 7B shows steps (a-5)/(b-5) to (a-7)/(b-7) in the manufacturing method for the semiconductor device shown in FIGS. 6A to 6C.
Figure 7B:
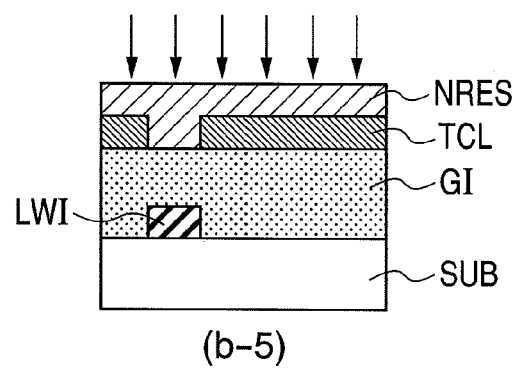
Figure 7B:
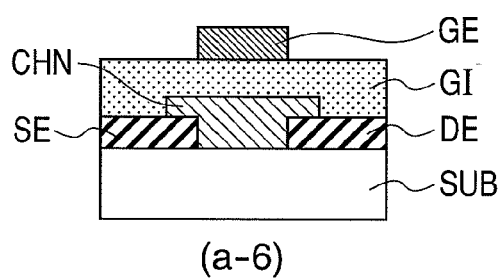
Figure 7B:
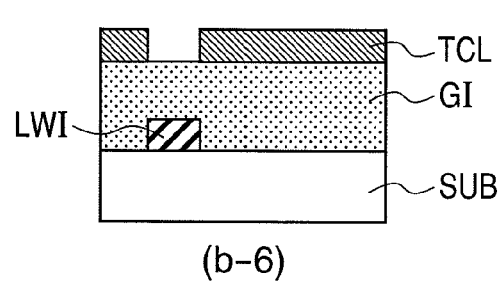
Figure 7B:
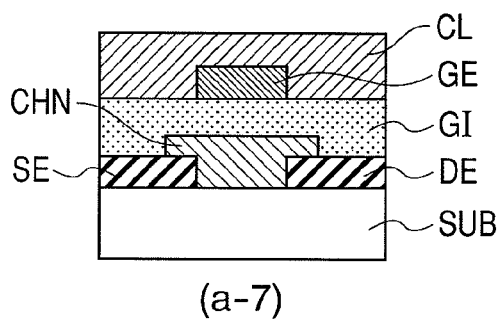
Figure 7B:
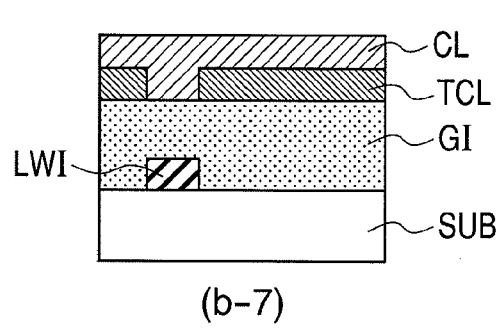
Figure 7C:
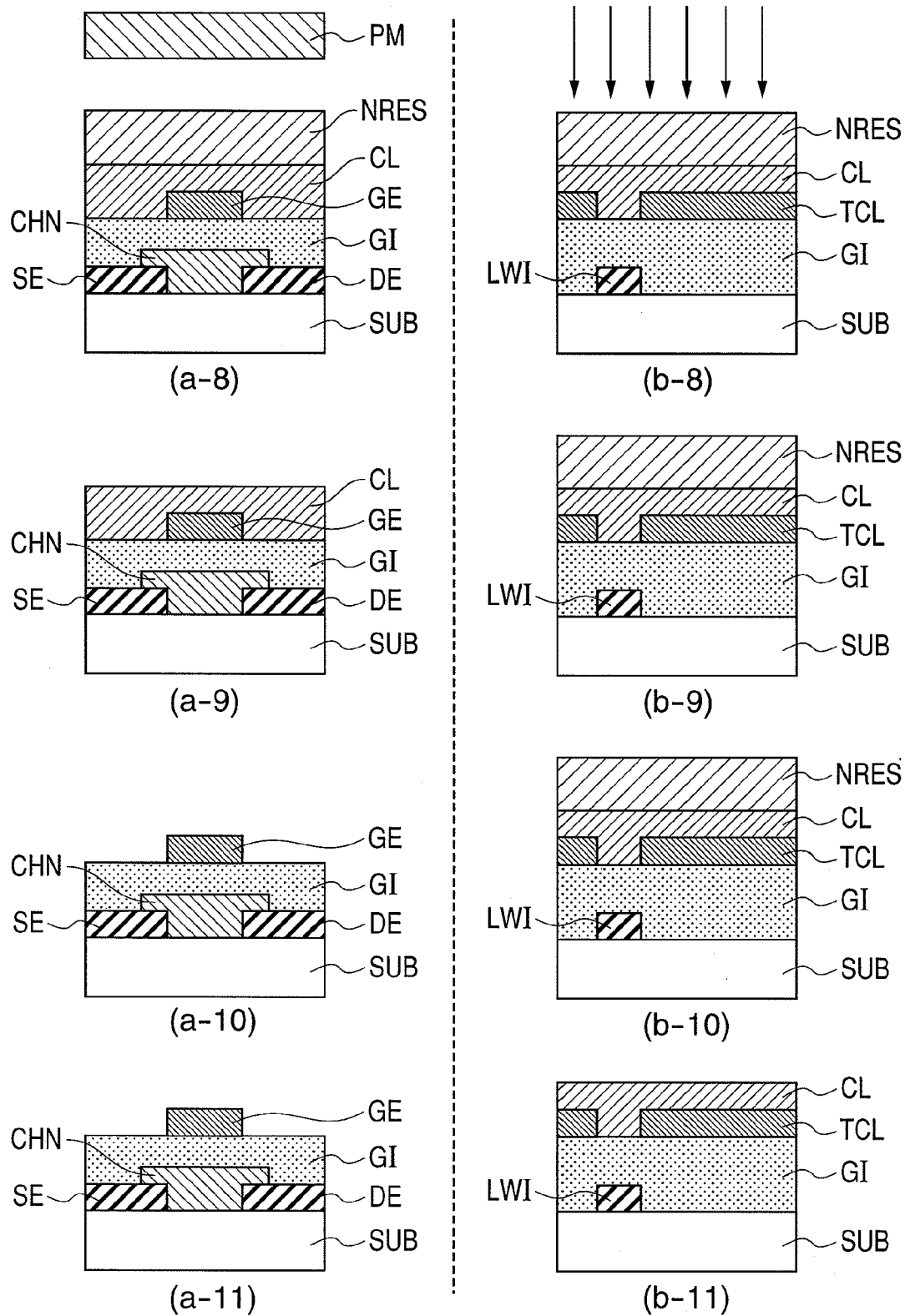
FIG. 7C shows steps (a-8)/(b-8) to (a-11)/(b-11) in the manufacturing method for the semiconductor device shown in FIGS. 6A to 6C.

FIGS. 7A to 7C show steps for manufacturing the TFT shown in FIGS. 6A to 6C. (a-1) to (a-7) illustrate cross sections of the manufacturing steps, taken along the line A-A' in FIG. 6A. (b-1) to (b-7) illustrate cross sections of the manufacturing steps, taken along the line B-B' in FIG. 6A. (a-1) and (b-1) illustrate a manufacturing step; (a-2) and (b-1) illustrate a manufacturing step; (a-3) and (b-3) illustrate a manufacturing step; (a-4) and (b-4) illustrate a manufacturing step; (a-5) and (b-5) illustrate a manufacturing step; (a-6) and (b-6) illustrate a manufacturing step; (a-7) and (b-7) illustrate a manufacturing step; (a-8) and (b-8) illustrate a manufacturing step; (a-9) and (b-9) illustrate a manufacturing step; (a-10) and (b-10) illustrate a manufacturing step; and (a-11) and (b-11) illustrate a manufacturing step.

(a-1) and (b-1) in FIG. 7A are the same as (a-1) and (b-1) in FIG. 3A, so description thereof is omitted.

Next, in the step illustrated in (a-2) and (b-2), the unexposed part of the negative resist NRES is removed to make a negative resist pattern.

Next, in the step illustrated in (a-3) and (b-3), the transparent conductive layer TCL is etched using the exposed part of the negative resist NRES as an etching mask. Consequently the gate electrode GE is formed in the channel direction.

Next, in the step illustrated in (a-4) and (b-4), the exposed part of the negative resist NRES is also removed.

Next, in the step illustrated in (a-5) and (b-5), in order to form the upper wire interconnect UWI from the transparent conductive layer TCL, the transparent conductive layer TCL is shaped into the gate electrode GE and upper wire interconnect UWI using an ordinary photolithographic technique and wet or dry etching. Although (a-5) and (b-5) illustrate a case that negative resist NRES is used, it is needless to say that positive resist may be used instead. In the latter case, the photo mask used in the step illustrated in (a-5) and (b-5) is negative-positive reversed.

Next, the structure as illustrated in (a-6) and (b-6) is obtained.

Next, in the step illustrated in (a-7) and (b-7), conductive layer CL is formed over the gate insulating film GI, the gate electrode GE and the upper wire interconnect UWI (transparent conductive layer TCL) in order to fill a gap region in the upper wire interconnect UWI (transparent conductive layer TCL). The conductive layer CL is deposited by CVD or sputtering and processed by a combination of an ordinary photolithographic technique and dry etching.

Next, in the step illustrated in (a-8) and (b-8), negative resist NRES is coated on the conductive layer CL. Then, using a photo mask PM, the negative resist NRES over the upper wire interconnect UWI (transparent conductive layer TCL) and the area of intersection of the lower wire interconnect LWI and the upper wire interconnect UWI are exposed to light from the front side. The purpose of the conductive layer CL is to fill a gap region in the transparent conductive layer TCL, so at least the area of intersection of the lower wire interconnect LWI and the upper wire interconnect UWI should be exposed to light from the front side.

Next, in the step illustrated in (a-9) and (b-9), the unexposed part of the negative resist NRES is removed to make a negative resist pattern.

Next, in the step illustrated in (a-10) and (b-10), the conductive layer CL is etched using the exposed part of the negative resist NRES as an etching mask. Consequently, the upper wire interconnect UWI has a double-layer structure comprised of the transparent conductive layer TCL and conductive layer CL. Although (a-8), (b-8), (a-9), (b-9), (a-10) and (b-10) illustrate a case that negative resist NRES is used, it is needless to say that positive resist may be used instead. In the latter case, the photo mask used in the step illustrated in (a-8) and (b-8) is negative-positive reversed.

Next, the exposed part of the negative resist NRES is also removed to obtain a structure illustrated in (a-11) and (b-11).

Since the above process does not require high temperature processing, the TFT can be easily formed on a flexible substrate like a plastic film.

Since exposure light from back in the step of (b-1) is blocked by the lower wire interconnect LWI, the area of intersection of the lower wire intersect LWI and upper wire intersect UWI is not exposed to light and the negative resist NRES in the area of intersection is removed. The upper wire interconnect UWI (transparent conductive layer TCL) in the area of intersection is divided by etching, producing a gap region. In the manufacturing process shown in FIGS. 7A to 7C, this gap region is filled with the conductive layer CL and the divided upper wire interconnect UWI (transparent conductive layer) can be shorted. In addition, since the upper wire interconnect UWI has a double-layer structure comprised of the transparent conductive layer TCL and conductive layer CL, it provides higher conductivity.

Figure 8:
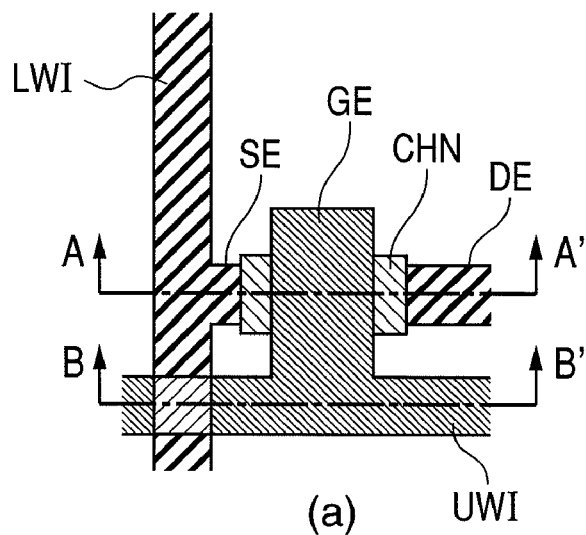
Figure 8:
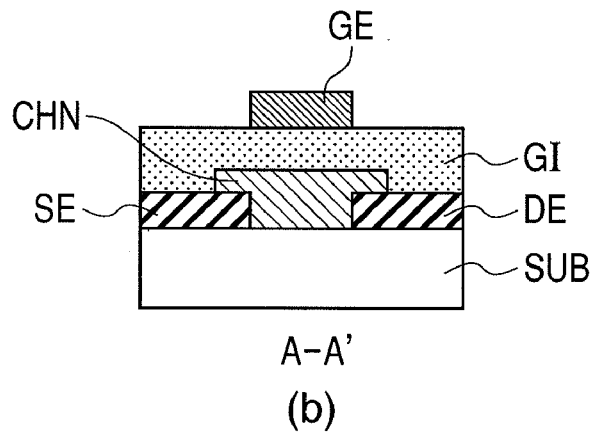
Figure 8:
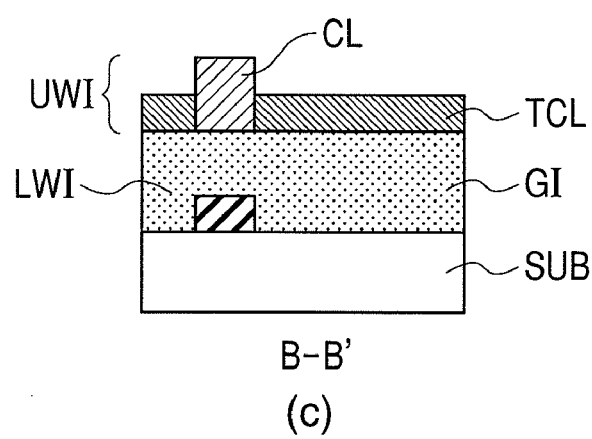

FIGS. 8A to 8C show a top-gate bottom-contact TFT which uses an oxide semiconductor. FIG. 8A is a top view of the TFT. FIG. 8B is a sectional view taken along the line A-A' in FIG. 8A. FIG. 6C is a sectional view taken along the line B-B' in FIG. 8A. FIGS. 8A to 8C are different from FIGS. 6A to 6C in that the upper wire interconnect UWI does not have a double-layer structure and only the gap region of the transparent conductive layer TCL is filled by the conductive layer CL.

Figure 9:
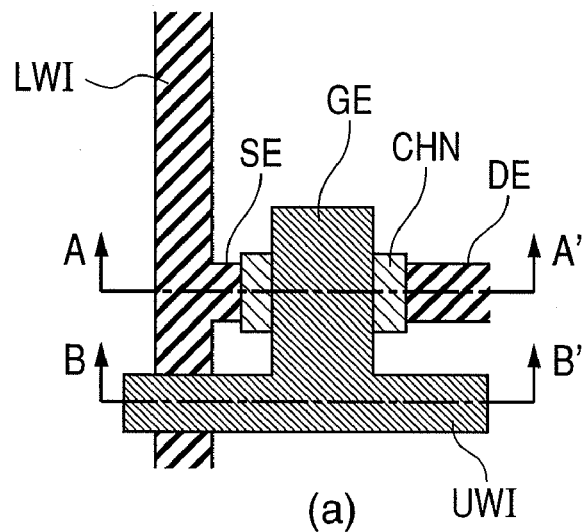
Figure 9:
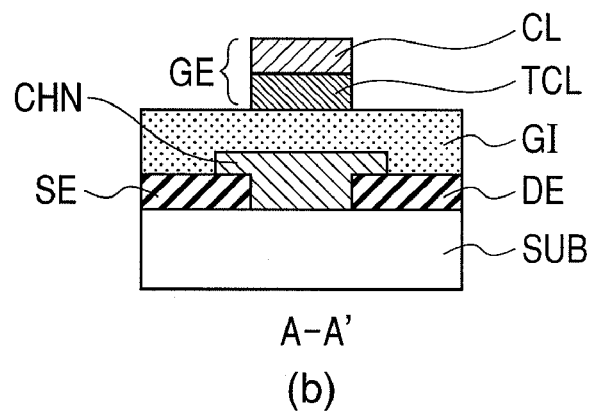
Figure 9:
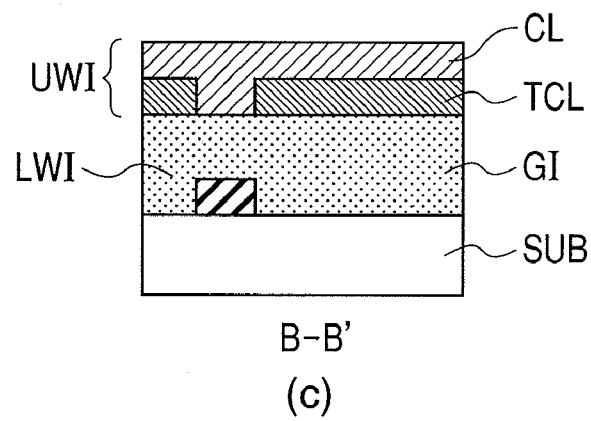

FIGS. 9A to 9C show a top-gate bottom-contact TFT which uses an oxide semiconductor. FIG. 9A is a top view of the TFT. FIG. 9B is a sectional view taken along the line A-A' in FIG. 9A. FIG. 9C is a sectional view taken along the line B-B' in FIG. 9A. FIGS. 9A to 9C are different from FIGS. 6A to 6C in that the gate electrode GE has a double-layer structure comprised of the transparent conductive layer TCL and conductive layer CL.

Figure 10:
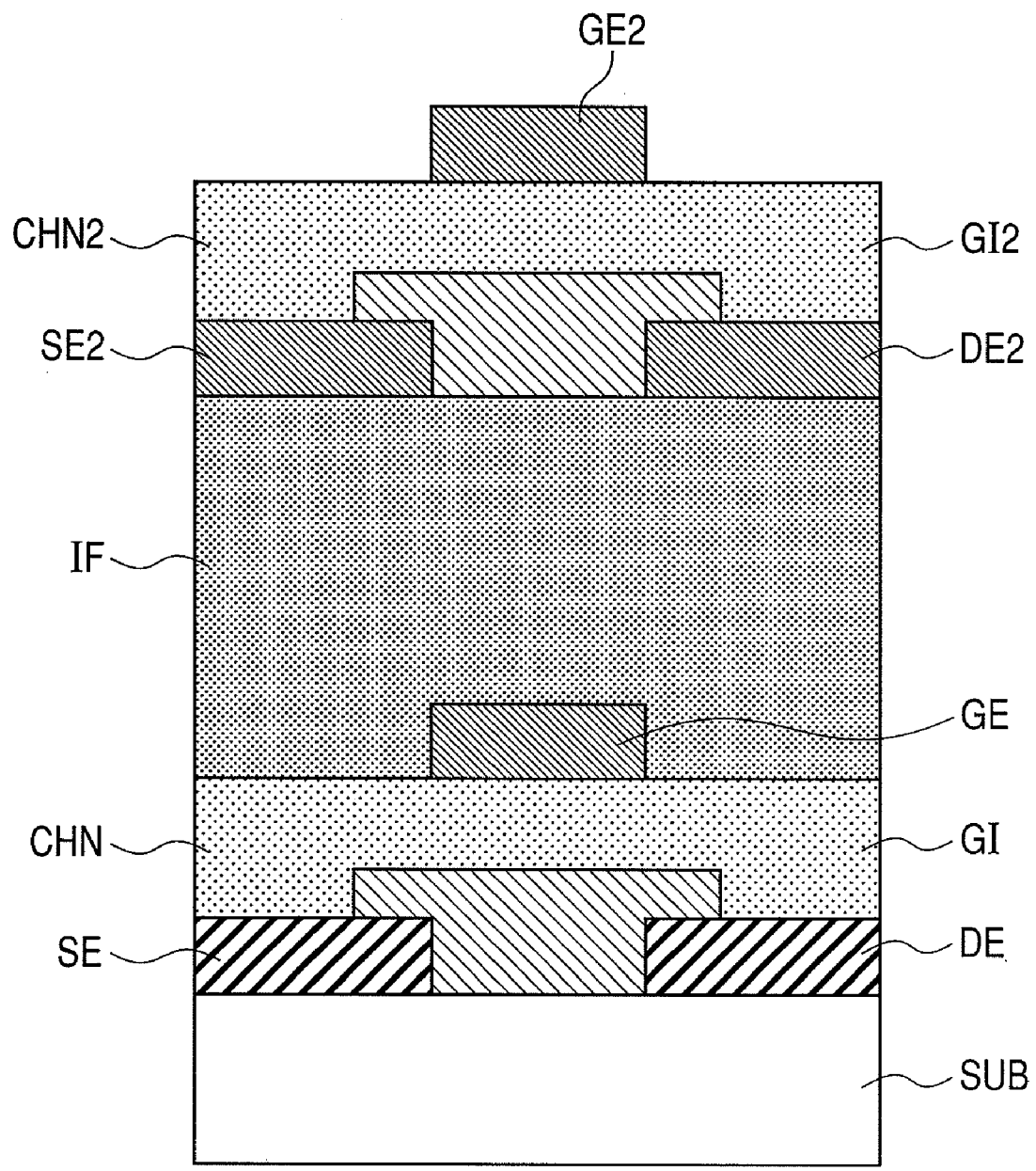
FIG. 10 is a sectional view of a semiconductor device according to the first embodiment.

FIG. 10 shows a semiconductor device in which two TFTs according to the first embodiment are stacked. The semiconductor device shown in FIG. 10 is produced as follows: a TFT (FIG. 2A or FIG. 6A) is produced according to the above method and then the TFT is covered by an insulating film IF and another TFT is produced over it. In the process of producing the second TFT, the gate source electrode SE and drain electrode DE previously made of metal are used as a mask for back exposure so that the source electrode SE2, drain electrode DE2, and gate electrode GE2 are formed in a self-aligned manner. Although top-gate bottom-contact TFTs are used for the semiconductor device shown in FIG. 10, top-gate top-contact TFTs according to a second embodiment of the invention may be used instead.

In the self-aligned oxide TFT according to the first embodiment, overlaps OL between the source electrode SE and the gate electrode GE and between the drain electrode DE and the gate electrode GE, which would be generated if they were formed through the exposure process using only front exposure, and parasitic capacitances CP due to such overlaps OL are suppressed. Also, since the source electrode SE and drain electrode DE are made of metal, the resistances of these electrodes or the interconnects formed integrally with them are sufficiently low.

Second Embodiment

FIGS. 11A to 11D show the structure of a semiconductor device according to the second embodiment of the present invention and a method for manufacturing the same. In this case, the semiconductor device is a top-gate top-contact oxide TFT. Here, "top-gate" means that a gate electrode GE is formed in a layer above a channel layer CHN, and "top-contact" means that a source electrode SE and a drain electrode DE are formed in a layer above the channel layer CHN.

Figure 11:
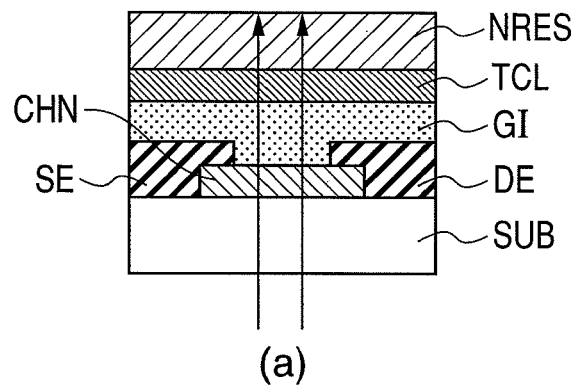
Figure 11:
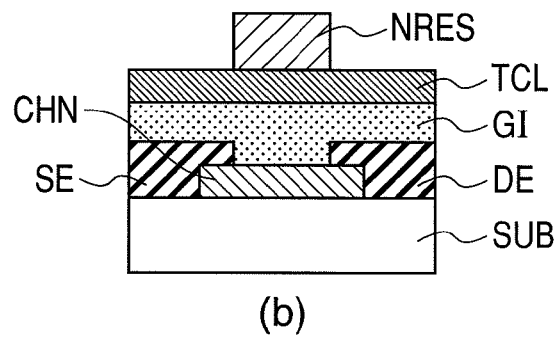
Figure 11:
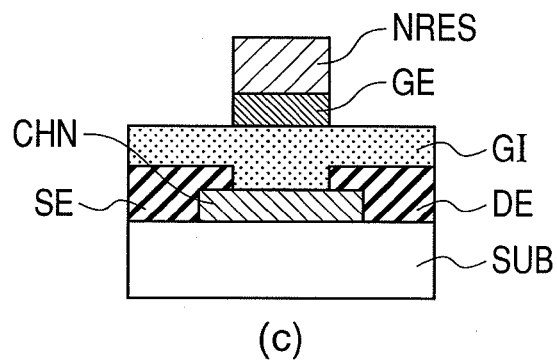
Figure 11:
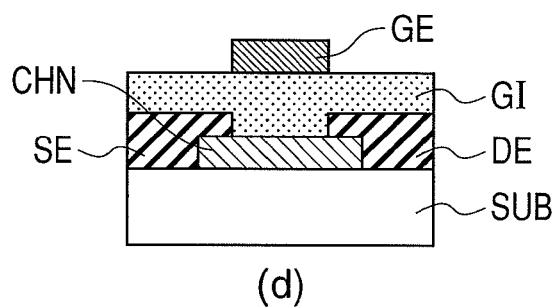

The semiconductor device manufacturing method according to the second embodiment is as follows (details of each step are equivalent to those in the first embodiment). First, as shown in FIG. 11A, a semiconductor channel layer CHN is formed over a transparent substrate SUB. Then, a source electrode SE and a drain electrode DE of metal are formed over the semiconductor channel layer CHN. The source electrode SE and drain electrode DE are spaced from each other with a given distance or spacing region between them and this spacing region lies just above the semiconductor channel layer CHN. A gate insulating film GI is formed so as to cover the semiconductor channel layer CHN, source electrode SE and drain electrode DE. Then, a transparent conductive layer TCL is formed over the gate insulating film GI and negative resist NRES is coated on it and the negative resist NRES is exposed to light from the back of the substrate SUB (back exposure). In this exposure step, the source electrode SE and drain electrode DE, both made of metal, function as a mask and unmasked parts transmit exposure light so that the negative resist NRES is exposed in a self-aligned manner with respect to the source electrode SE and drain electrode DE. Next, the negative resist NRES is patterned as illustrated in FIG. 11B to shape the transparent conductive layer TCL into the gate electrode GE as shown in FIG. 11C. Then, the negative resist NRES is removed to obtain a structure as shown in FIG. 11D. Finally, as in the process shown in FIGS. 6A to 6C, the transparent conductive layer TCL is shaped into the gate electrode GE by a combination of an ordinary photolithographic technique and wet or dry etching to obtain a TFT structure.

In the above process for the gate electrode GE, self-aligned processing including back exposure is first carried out and then ordinary photolithographic processing is carried out. However, this order may be reversed.

FIGS. 11A to 11D show a case that dry etching is done to form the source electrode SE and drain electrode DE, in which the source electrode SE and drain electrode DE have virtually vertical ends on the spacing region side. Here, as in the first embodiment, wet etching may be adopted instead of dry etching. If wet etching is adopted, the spacing region side end of the source electrode SE and that of the drain electrode DE are tapered with the height decreasing toward the bottom of each end. While the dry etching process is advantageous in that the processing accuracy is improved, the wet etching process is advantageous in that damage to the channel layer CHN is small.

The various members used in the second embodiment are made of the same materials as in the first embodiment.

Figure 1:
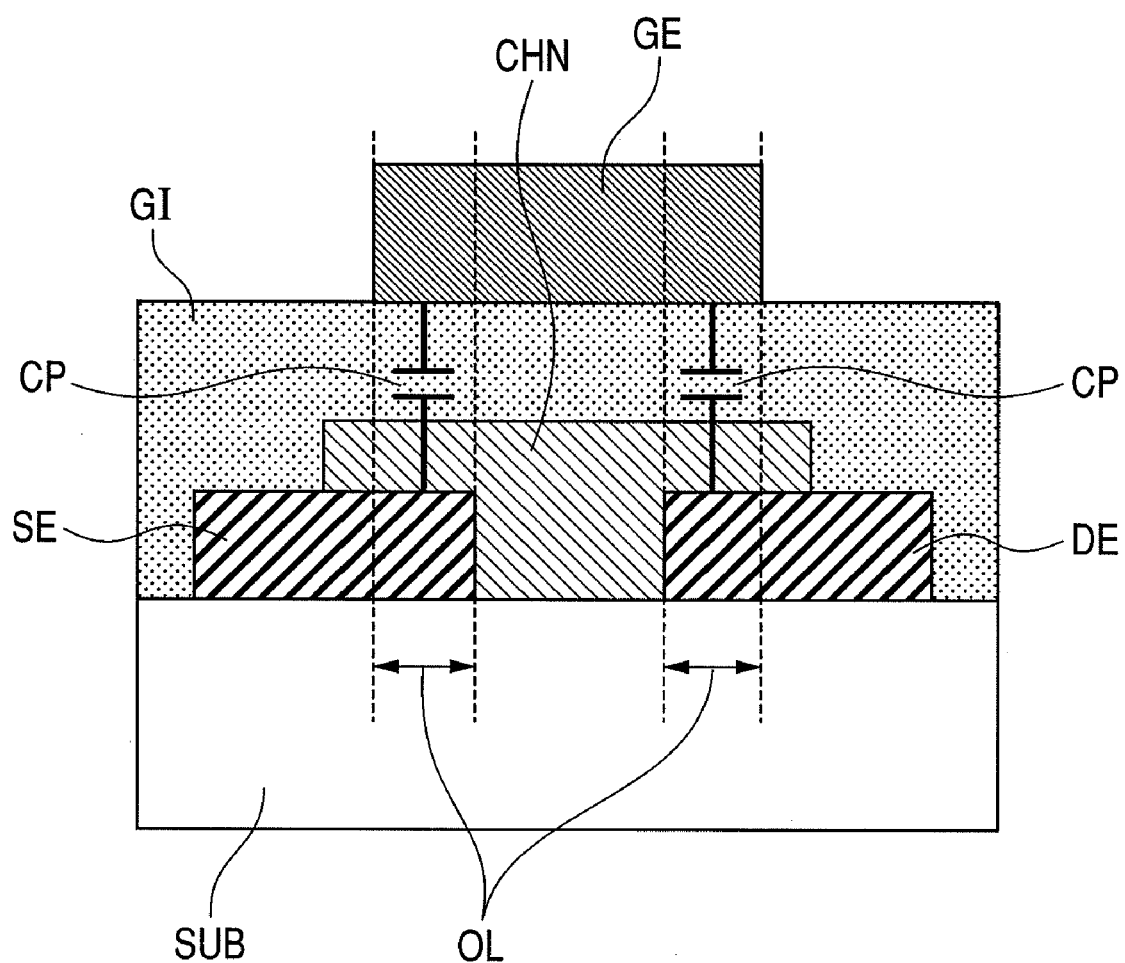
FIG. 1 is a sectional view illustrating overlaps between electrodes and parasitic capacitances in an oxide TFT.

In the self-aligned oxide semiconductor TFT according to the second embodiment, overlaps OL between the source electrode SE and the gate electrode GE and between the drain electrode DE and the gate electrode GE, which would be generated if they were formed through the exposure process using only front exposure as shown in FIG. 1, and parasitic capacitances CP due to such overlaps OL are suppressed. Also, since the source electrode SE and drain electrode DE are made of metal, the resistances of these electrodes or the interconnects formed integrally with them are sufficiently low.

Third Embodiment

FIGS. 12A to 12D show the structure of a semiconductor device according to a third embodiment of the present invention and a method for manufacturing the same. In this case, the semiconductor device is a bottom-gate top-contact oxide TFT. Here, "bottom-gate" means that a gate electrode GE is formed in a layer below a channel layer CHN, and "top-contact" means that a source electrode SE and a drain electrode DE are formed in a layer above the channel layer CHN.

Figure 12:
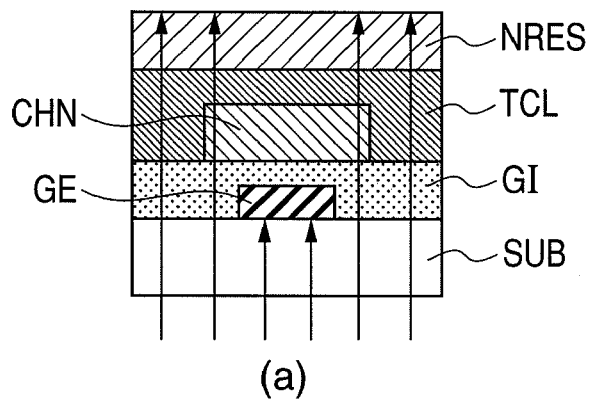
Figure 12:
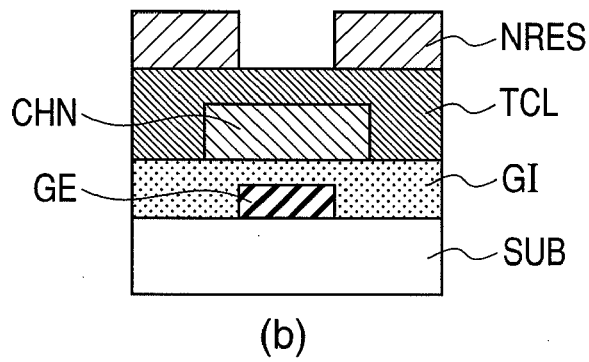
Figure 12:
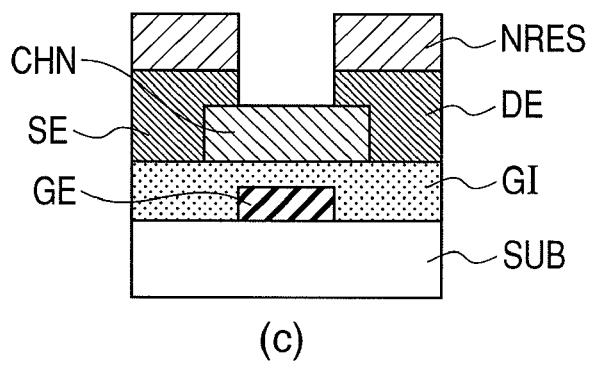
Figure 12:
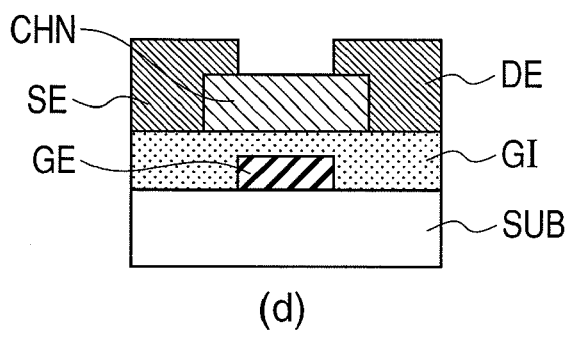

The semiconductor device manufacturing method according to the third embodiment is as follows. First, as shown in FIG. 12A, a gate electrode GE of metal is formed over a transparent substrate SUB. The metal film is deposited by CVD or sputtering. An ordinary photolithographic technique and dry or wet etching are combined to shape the gate electrode GE.

Next, a gate insulating film GI is formed so as to cover the gate electrode GE. This gate insulating film is deposited by CVD or sputtering.

Then, a semiconductor channel layer CHN is formed over the gate insulating film GI so as to cover the gate electrode GE. The oxide semiconductor film is deposited by sputtering or the like and an ordinary photolithographic technique and wet or dry etching are combined to shape the channel layer CHN.

Then, a transparent conductive layer TCL is formed by sputtering or the like so as to cover the channel layer CHN and negative resist NRES is coated on it and the negative resist NRES is exposed to light from the back of the transparent substrate SUB (back exposure). In this exposure step, the gate electrode GE, made of metal, functions as a mask and unmasked parts transmit exposure light so that the negative resist NRES is exposed in a self-aligned manner with respect to the gate electrode GE.

Figure 13:
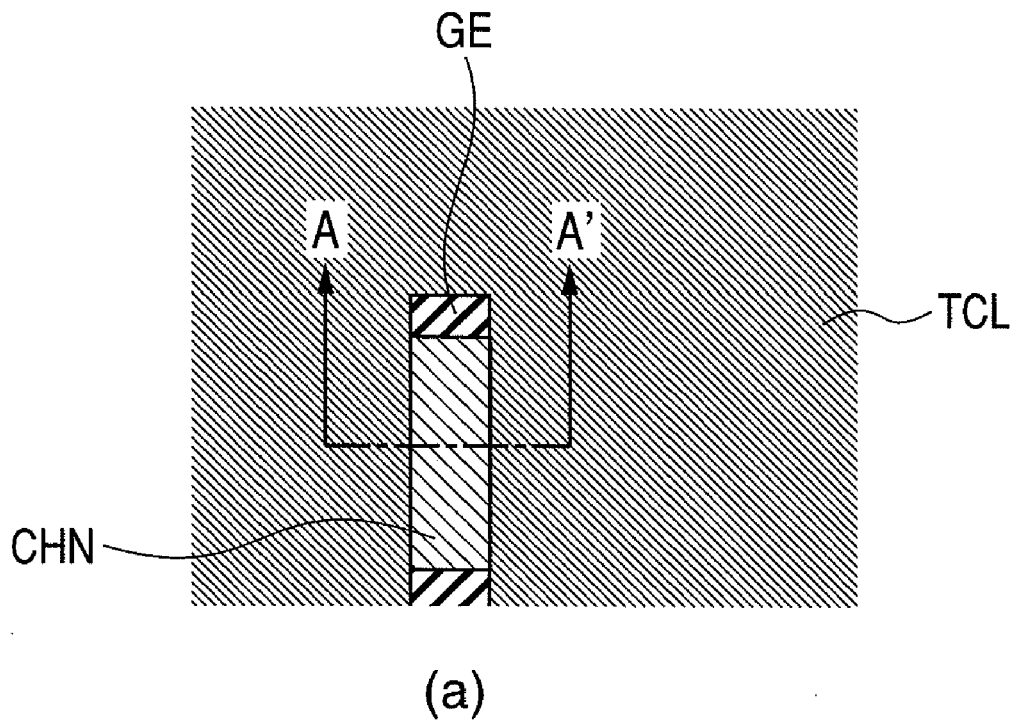
Figure 13:
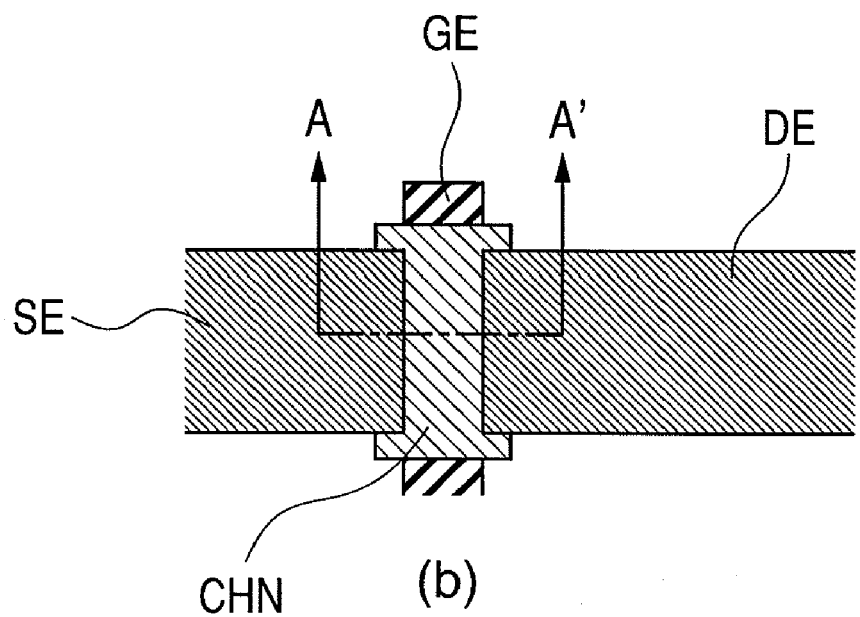

Next, the negative resist NRES is patterned as shown in FIG. 12B and the transparent conductive layer TCL is processed as shown in FIG. 12C. Then, the negative resist NRES is removed to obtain a structure as shown in FIG. 12D (sectional view taken along the line A-A' in FIG. 13A) and FIG. 13A (top view). Finally, the transparent conductive layer TCL is shaped into the source electrode SE and drain electrode DE by a combination of an ordinary photolithographic technique and wet or dry etching to obtain a TFT structure as shown in FIG. 13B.

In the above process for the source electrode SE and drain electrode DE, self-aligned processing including back exposure is first carried out and then ordinary photolithographic processing is carried out. However, this order may be reversed.

The various members used in the third embodiment are basically made of the same materials as in the first embodiment. As can be understood from the above explanation of the manufacturing method, the same material as used for the source electrode SE and drain electrode DE in the first embodiment is used for the gate electrode GE and the same material as used for the gate electrode GE in the first embodiment is used for the source electrode SE and drain electrode DE.

In this embodiment, since the channel layer CHN is made of oxide semiconductor, short-wavelength light like i rays (365 nm) of a mercury lamp can be used for back exposure. In addition, the oxide semiconductor which constitutes the semiconductor channel layer CHN is low in contact resistance with many metals, so the semiconductor channel layer CHN can be connected directly with the metal film which constitutes the source electrode SE and drain electrode DE.

FIGS. 12A to 12D show a case that dry etching is done to form the source electrode SE and drain electrode DE, in which the source electrode SE and drain electrode DE have virtually vertical ends on the spacing region side. Here, as in the first embodiment, wet etching may be adopted instead of dry etching. If wet etching is adopted, the spacing region side end of the source electrode SE and that of the drain electrode DE are tapered with the height decreasing toward the bottom of each end. While the dry etching process is advantageous in that the processing accuracy is improved, the wet etching process is advantageous in that damage to the channel layer CHN is small.

Suppose that a lower wire interconnect LWI is made in the same step for formation of the gate electrode GE according to the manufacturing method shown in FIGS. 12A to 12D and an upper wire interconnect UWI is made in the same step for formation of the source electrode SE and drain electrode DE. Since exposure light from back is blocked by the lower wire interconnect LWI, the area of intersection of the lower wire intersect LWI and upper wire intersect UWI is not exposed to light and the negative resist NRES in the area of intersection is removed; as a consequence, the upper wire interconnect UWI in the area of intersection is divided by etching, producing a gap region. This gap region must be filled and the divided upper wire interconnect UWI must be shorted.

FIGS. 13A and 13B show the gate electrode and its vicinity in the TFT shown in FIGS. 12A to 12D. FIG. 13A shows the transparent conductive layer shown in FIG. 12D and FIG. 13B shows the gate electrode and its vicinity in the TFT with the source electrode and drain electrode formed from the transparent conductive layer TCL.

Referring to FIGS. 14A to 14D, how the gap region is filled with the conductive layer CL of metal or metal oxide and the divided upper wire interconnect UWI is shorted will be explained below.

Figure 14:
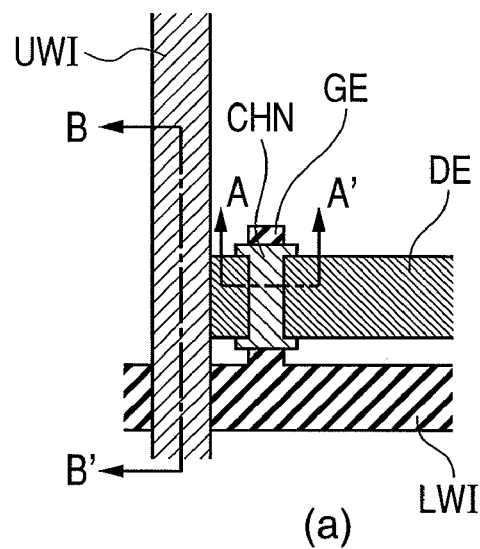
Figure 14:
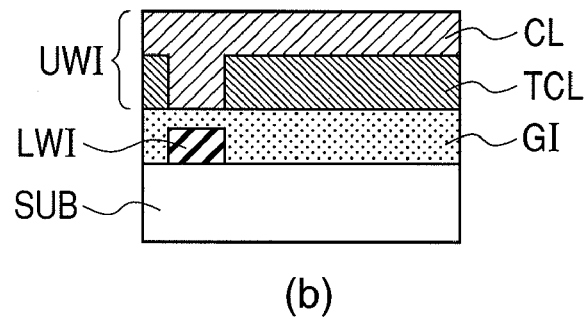
Figure 14:
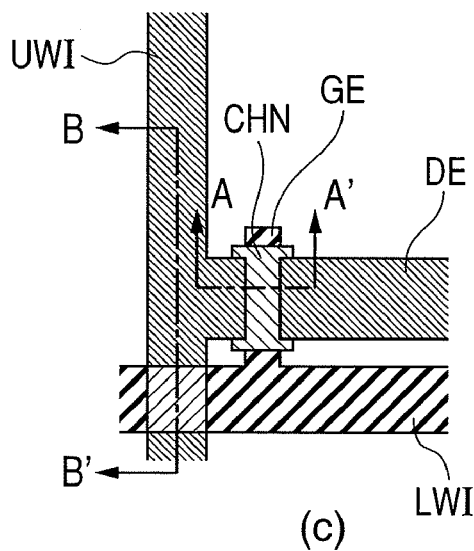
Figure 14:
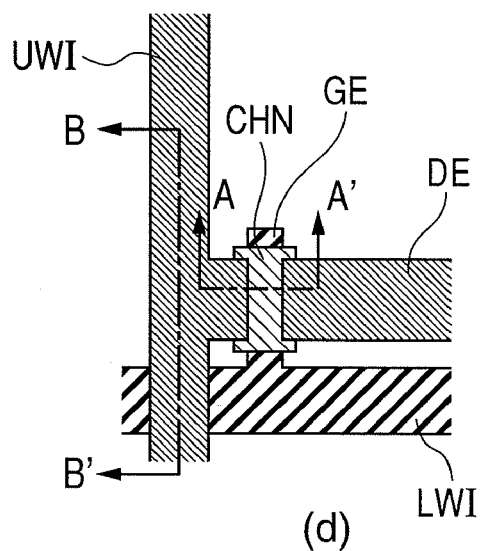

FIGS. 14A to 14D show a semiconductor device in which the gate electrode GE is integral with the lower wire interconnect LWI and the source electrode SE is integral with the upper wire interconnect UWI. FIGS. 12A to 12D illustrate cross sections taken along the line A-A' in FIG. 14A and FIG. 14B illustrates a cross section taken along the line B-B'.

In the process of FIGS. 14A to 14D, the lower wire interconnect LWI is processed and formed in the same step in which the gate electrode GE is formed as shown in FIGS. 12A to 12D. Specifically, the film for the lower wire interconnect LWI is deposited by CVD or sputtering and processed by a combination of an ordinary photolithographic technique and dry etching.

The gate insulating film GI which lies between the lower wire interconnect LWI and upper wire interconnect UWI is made in the same step for formation of the gate insulating film as shown in FIGS. 12A to 12D. Specifically, the gate insulating film GI is deposited by CVD or sputtering.

The transparent conductive layer TCL which constitutes the upper wire interconnect UWI is processed and formed in the same step for formation of the source electrode SE and drain electrode DE as shown in FIGS. 12A to 12D. Specifically the film for the upper wire interconnect UWI is deposited by sputtering or the like and processing, or shaping, is performed in two steps: self-aligned processing including back exposure and an ordinary photolithographic process. The conductive layer CL which constitutes the upper wire interconnect UWI is deposited by sputtering or the like and processing is done by a combination of an ordinary photolithographic technique and wet or dry etching.

As shown in FIG. 14C, the conductive layer CL may also be made only in the area of intersection of the lower wire interconnect LWI and upper wire interconnect UWI through a process similar to the process shown in FIG. 14A. Alternatively, as shown in FIG. 14D, the conductive layer CL may be made not only over the upper wire interconnect UWI but also over the source electrode SE and drain electrode DE through a similar process.

Although FIGS. 14A to 14D show a case that the TFT is a bottom-gate top-contact TFT, it may be a bottom-gate bottom-contact TFT according to a fourth embodiment of the invention.

Figure 15:
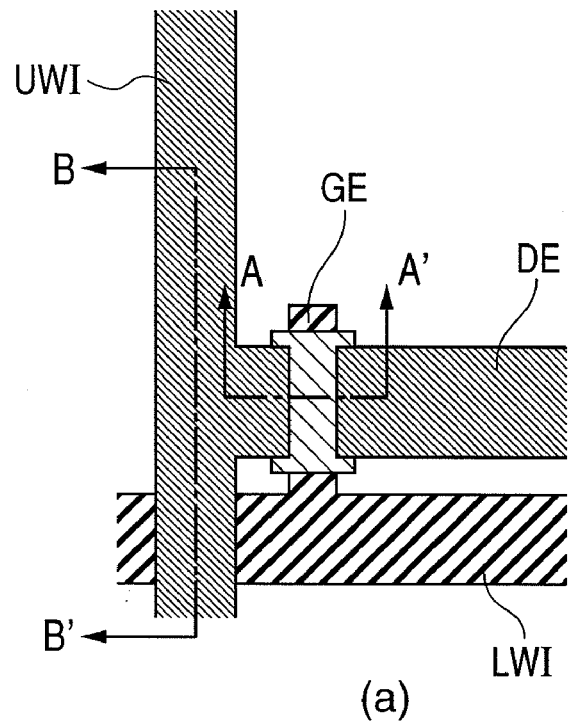
Figure 15:
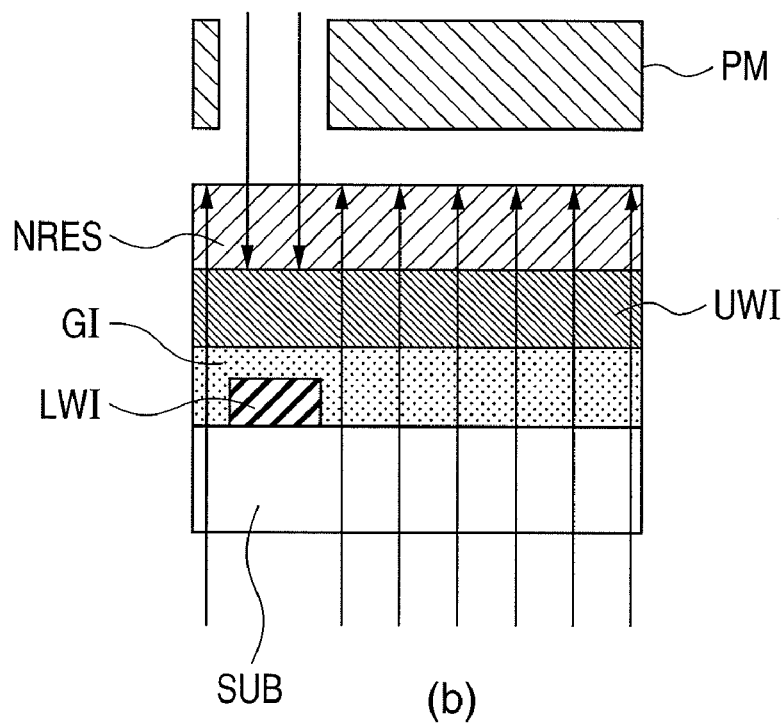

FIGS. 15A and 15B show a semiconductor device in which the gate electrode GE and lower wire interconnect LWI are formed integrally and the source electrode SE and upper wire interconnect UWI are formed integrally by a different process. FIGS. 12A to 12D illustrate cross sections taken along the line A-A' in FIG. 15A and FIG. 15B illustrates a cross section taken along the line B-B'.

Since the difference of FIGS. 15A and 15B from FIGS. 14A to 14D exists only in the exposure method for negative resist NRES, the steps before coating of negative resist NRES are the same as explained in reference to FIGS. 14A to 14D.

In the structure shown in FIGS. 15A and 15B, the negative resist NRES in the intersection area is selectively exposed to light from the front side using an ordinary photo mask PM. This prevents division of the upper wire interconnect UWI. This front exposure may be made before or after back exposure or may be made simultaneously with back exposure. Although FIGS. 15A and 15B show a case that the TFT is a bottom-gate top-contact TFT, it may be a bottom-gate bottom-contact TFT according to the fourth embodiment of the invention.

Figure 16:
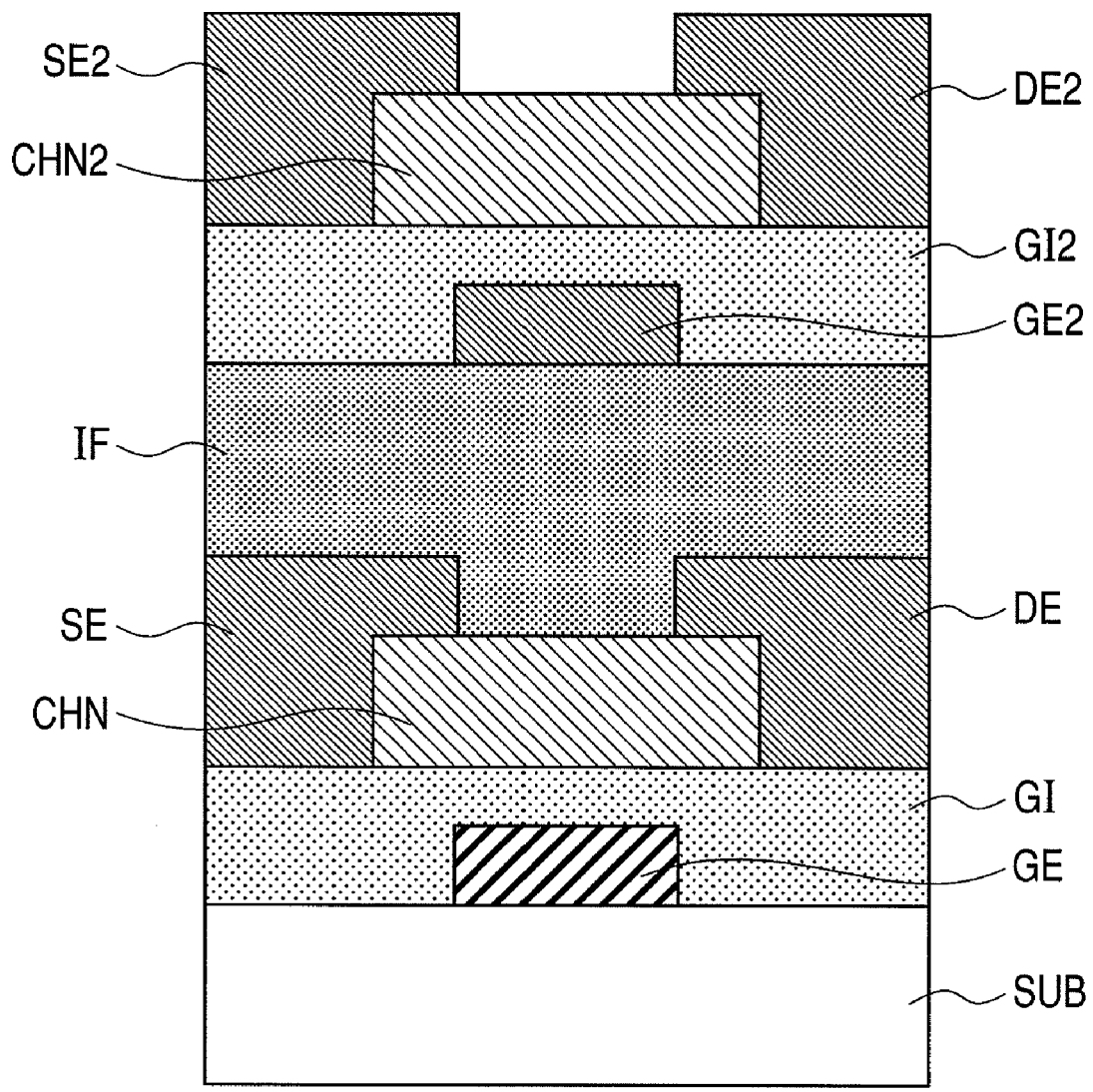
FIG. 16 is a sectional view showing the structure of a semiconductor device according to the third embodiment.

FIG. 16 shows a semiconductor device in which two TFTs according to the third embodiment are stacked. The semiconductor device shown in FIG. 16 is produced as follows: a TFT as shown in FIG. 12D is produced according to the above method and then the TFT is covered by an insulating film IF and another TFT is produced over it. In the process of producing the second TFT, the gate electrode GE previously made of metal is used as a mask for back exposure so that the gate electrode GE2, source electrode SE2, and drain electrode DE2 are formed in a self-aligned manner. Although bottom-gate top-contact TFTs are used for the semiconductor device shown in FIG. 16, bottom-gate bottom-contact TFTs according to the fourth embodiment may be used instead.

In the self-aligned oxide TFT according to the third embodiment, overlaps OL between the source electrode SE and the gate electrode GE and between the drain electrode DE and the gate electrode GE, which would be generated if they were formed through the exposure process using only front exposure, and parasitic capacitances CP due to such overlaps OL are suppressed.

Fourth Embodiment

FIGS. 17A to 17E show the structure of a semiconductor device according to the fourth embodiment and a method for manufacturing the same. In this case, the semiconductor device is a bottom-gate bottom-contact oxide TFT. Here, "bottom-gate" means that a gate electrode GE is formed in a layer below a channel layer CHN, and "bottom-contact" means that a source electrode SE and a drain electrode DE are formed in a layer below the channel layer CHN.

Figure 17:
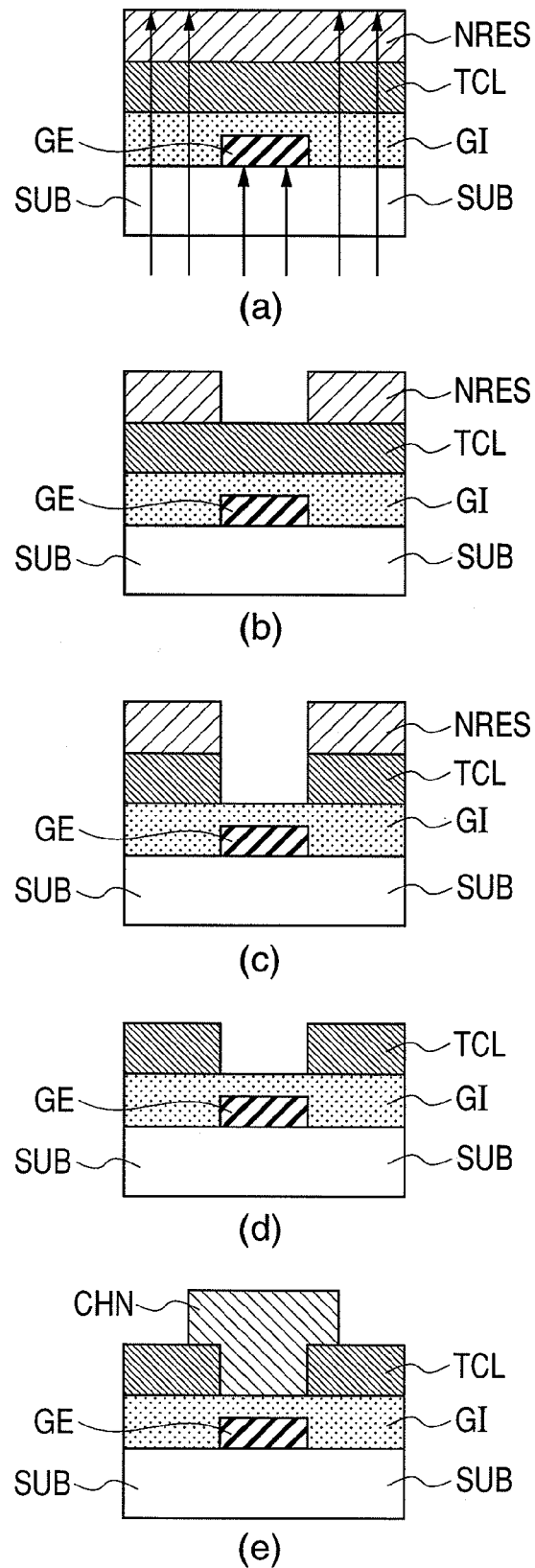

The semiconductor device manufacturing method according to the fourth embodiment is as follows (details of each step are equivalent to those in the third embodiment). First, as shown in FIG. 17A, a gate electrode GE of metal is formed over a transparent substrate SUB. The metal film is deposited by CVD or sputtering and it is shaped into the gate electrode GE by a combination of an ordinary photolithographic technique and dry etching.

Next, a gate insulating film GI is formed so as to cover the gate electrode GE. This gate insulating film is deposited by CVD or sputtering.

Then, a transparent conductive layer TCL is formed over the gate insulating film GI by sputtering or the like and negative resist NRES is coated on it and the negative resist NRES is exposed to light from the back of the transparent substrate SUB (back exposure). In this exposure step, the gate electrode GE, made of metal, functions as a mask and unmasked parts transmit exposure light so that the negative resist NRES is exposed in a self-aligned manner with respect to the gate electrode GE.

Then, the negative resist NRES is patterned as illustrated in FIG. 17B and the transparent conductive layer TCL is processed as illustrated in FIG. 17C. Then, the negative resist NRES is removed to obtain a structure as illustrated in FIG. 17D. Then, as in the process as shown in FIGS. 13A and 13B in the third embodiment, the transparent conductive layer TCL is shaped into the source electrode SE and drain electrode DE by a combination of an ordinary photolithographic technique and wet or dry etching to obtain a TFT structure.

Finally, a semiconductor channel layer CHN is formed so as to cover the gate electrode GE and straddle both the source electrode SE and drain electrode DE to obtain a TFT structure as illustrated in FIG. 17E. The oxide semiconductor film is deposited by sputtering or the like and an ordinary photolithographic technique and wet or dry etching are combined to shape it into the channel layer CHN.

In the above process, self-aligned processing including back exposure is first carried out to form the gate electrode GE and then ordinary photolithographic processing is carried out. However, the order in which these steps are carried out may be reversed.

FIGS. 17A to 17E show a case that dry etching is performed to form the source electrode SE and drain electrode DE, in which the source electrode SE and drain electrode DE have virtually vertical ends on the spacing region side. Here, as in the first embodiment, wet etching may be adopted instead of dry etching. If wet etching is adopted, the spacing region side end of the source electrode DE and that of the drain electrode DE are tapered with the height decreasing toward the bottom of each end. While the dry etching process is advantageous in that the processing accuracy is improved, the wet etching process is advantageous in that damage to the gate insulating film GI is small.

The various members used in the fourth embodiment are made of the same materials as in the third embodiment.

In the self-aligned oxide TFT according to the fourth embodiment, overlaps OL between the source electrode SE and the gate electrode GE and between the drain electrode DE and the gate electrode GE, which would be generated if they were formed through the exposure process using only front exposure as shown in FIG. 1, and parasitic capacitances CP due to such overlaps OL are suppressed.

Fifth Embodiment

FIGS. 18A to 18D show the structure of a semiconductor device according to the fifth embodiment and a method for manufacturing the same. In this case, the semiconductor device is a bottom-gate oxide TFT. Here, "bottom-gate" means that a gate electrode GE is formed in a layer below a channel layer CHN.

Figure 18:
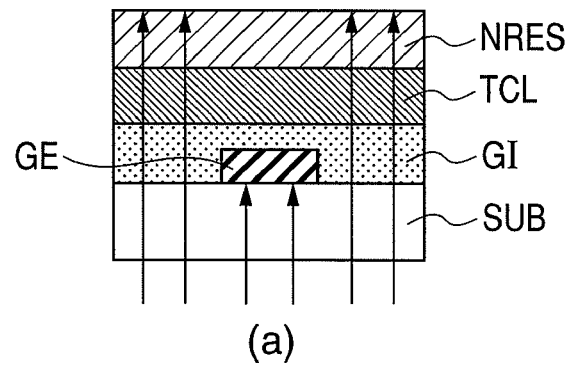
Figure 18:
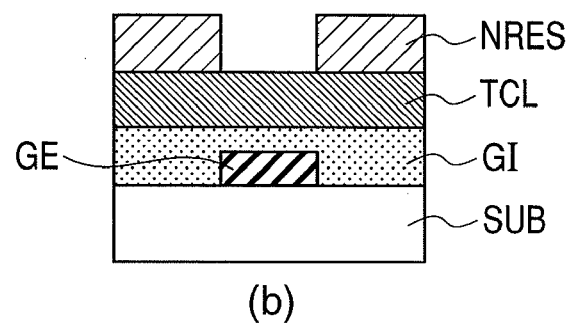
Figure 18:
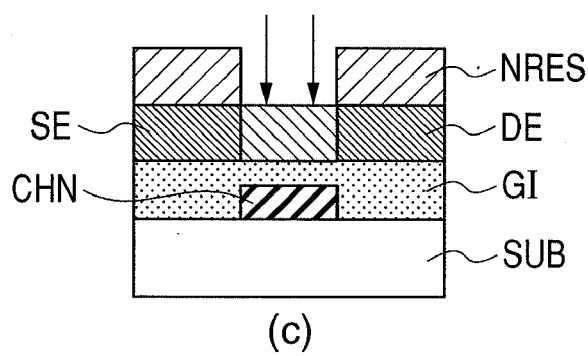
Figure 18:
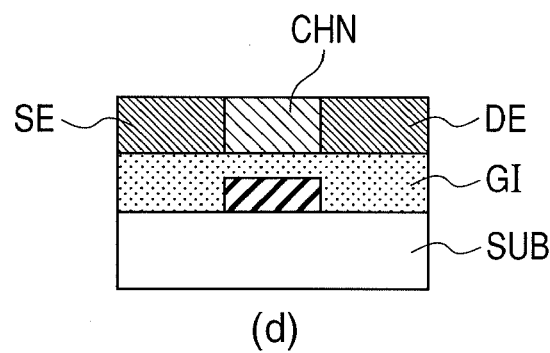

The semiconductor device manufacturing method according to the fifth embodiment is as follows (details of each step are equivalent to those in the first embodiment). First, as shown in FIG. 18A, a gate electrode GE of metal is formed over a transparent substrate SUB. Next, a gate insulating film GI is formed so as to cover the gate electrode GE. Then, a transparent conductive layer TCL is formed over the gate insulating film GI and negative resist NRES is coated on it and the negative resist NRES is exposed to light from the back of the transparent substrate SUB (back exposure). In this exposure step, the gate electrode GE, made of metal, functions as a mask and unmasked parts transmit exposure light so that the negative resist NRES is exposed in a self-aligned manner with respect to the gate electrode GE. Next, the negative resist NRES is patterned as illustrated in FIG. 18B. Then, a channel layer CHN is formed by partially modifying the transparent conductive layer (decreasing the carrier concentration by oxygen injection) through an opening in the negative resist NRES by oxygen plasma radiation or oxygen atmosphere annealing. The other portions of the transparent conductive layer as divided by the channel layer CHN become a source electrode SE and a drain electrode DE. Finally, the negative resist NRES is removed to obtain a TFT as illustrated in FIG. 18D.

Figure 19:
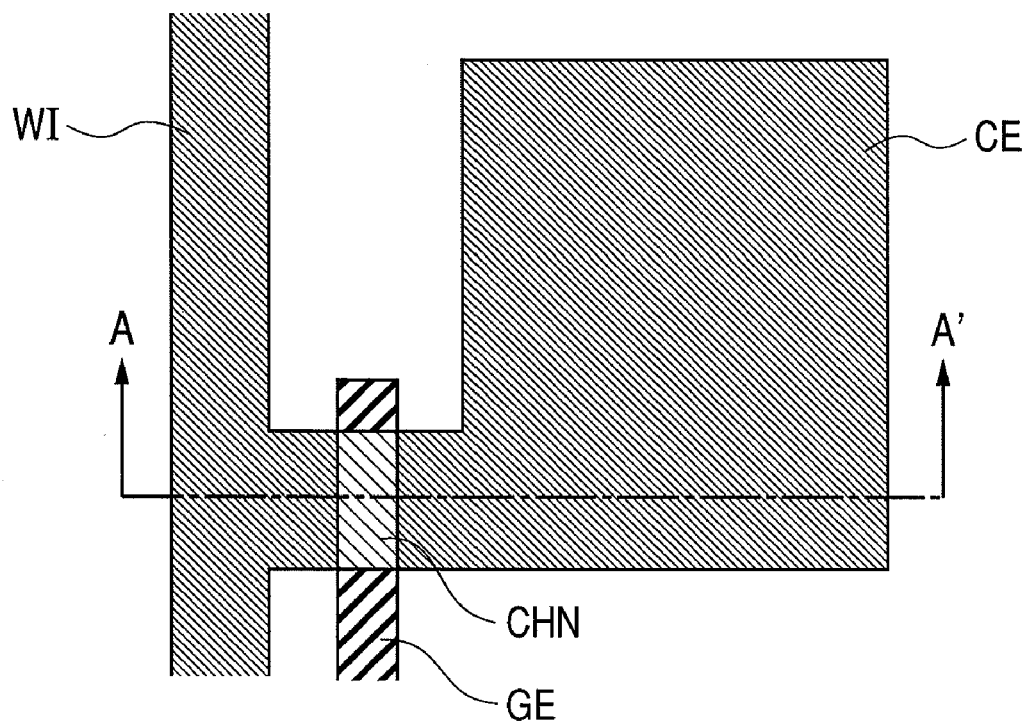
Figure 19:
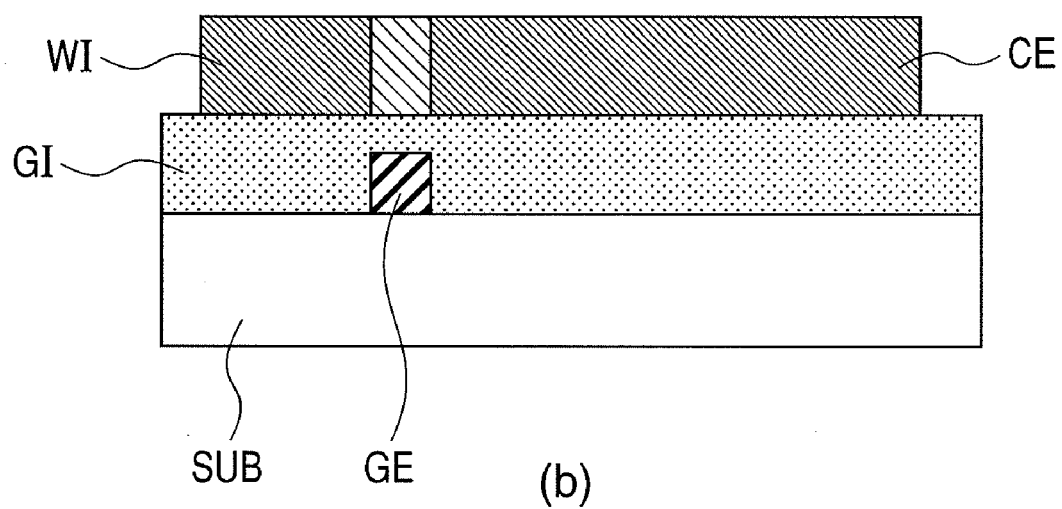

FIGS. 19A and 19B show the structure of a semiconductor device in which a wire interconnect WI and a capacitive electrode CE are formed simultaneously with formation of the TFT according to the fifth embodiment. FIG. 19A is a top view and FIG. 19B is a sectional view taken along the line A-A'.

The various members used in the fifth embodiment are made of the same materials as in the first embodiment.

In the self-aligned oxide TFT according to the fifth embodiment, overlaps OL between the source electrode SE and the gate electrode GE and between the drain electrode DE and the gate electrode GE, which would be generated if they were formed through the exposure process using only front exposure as shown in FIG. 1, and parasitic capacitances CP due to such overlaps OL are suppressed. Furthermore, since the channel layer CHN, source electrode SE, drain electrode DE and when necessary, wire interconnect WI and capacitive electrode CE can be formed integrally from a film, it is possible to provide a semiconductor device in which there is no contact resistance caused by hetero junction between the channel layer and the source/drain electrode. Also, the manufacturing process is simplified, leading to a low cost semiconductor device.

Sixth Embodiment

FIGS. 20A to 20D show the structure of a semiconductor device according to the sixth embodiment and a method for manufacturing the same. In this case, the semiconductor device is a bottom-gate oxide TFT. Here, "bottom-gate" means that a gate electrode GE is formed in a layer below a channel layer CHN.

Figure 20:
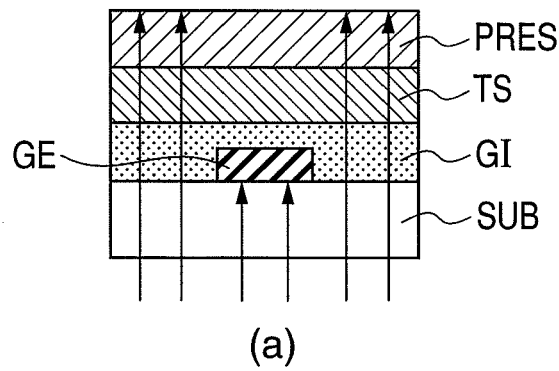
Figure 20:
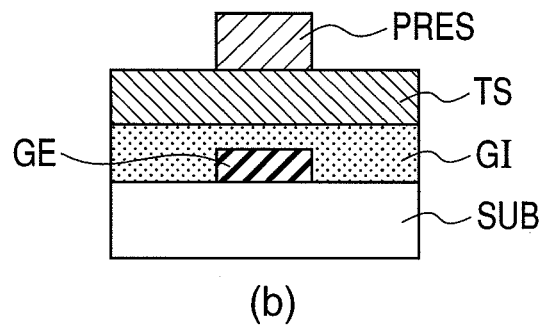
Figure 20:
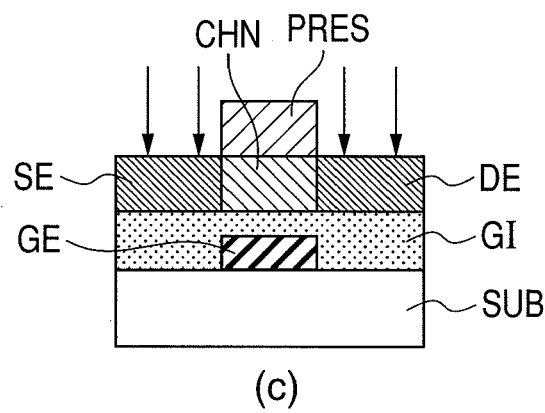
Figure 20:
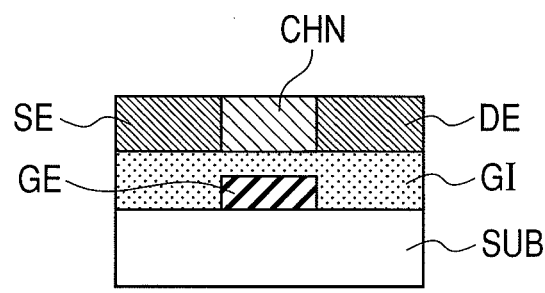

The semiconductor device manufacturing method according to the sixth embodiment is as follows (details of each step are equivalent to those in the first embodiment). First, as shown in FIG. 20A, a gate electrode GE of metal is formed over a transparent substrate SUB. Next, a gate insulating film GI is formed so as to cover the gate electrode GE. Then, a transparent semiconductor film TS is formed over the gate insulating film GI and positive resist PRES is coated on it and the positive resist PRES is exposed to light from the back of the transparent substrate SUB (back exposure). In this exposure step, the gate electrode GE, made of metal, functions as a mask and unmasked parts transmit exposure light so that the positive resist PRES is exposed in a self-aligned manner with respect to the gate electrode GE. Next, the positive resist PRES is patterned as illustrated in FIG. 20B. Then, a source electrode SE and a drain electrode DE are formed by partially modifying the transparent semiconductor film TS (increasing the carrier concentration by oxygen removal or hydrogen injection) through an opening in the positive resist PRES by plasma radiation, laser radiation or reductive atmosphere annealing. The other portion of the transparent semiconductor film TS becomes a channel layer CHN. Finally, the positive resist PRES is removed to obtain a TFT as illustrated in FIG. 20D. In the sixth embodiment as well, a wire interconnect WI and a capacitive electrode CE may be formed simultaneously with formation of the TFT as shown in FIGS. 19A and 19B.

The various members used in the sixth embodiment are made of the same materials as in the first embodiment.

In the self-aligned oxide TFT according to the sixth embodiment, overlaps OL between the source electrode SE and the gate electrode GE and between the drain electrode DE and the gate electrode GE, which would be generated if they were formed through the exposure process using only front exposure as shown in FIG. 1, and parasitic capacitances CP due to such overlaps OL are suppressed. Furthermore, since the channel layer CHN, source electrode SE, drain electrode DE and when necessary, wire interconnect WI and capacitive electrode CE can be formed integrally from a film, it is possible to provide a semiconductor device in which there is no contact resistance caused by hetero junction between the channel layer and the source/drain electrode. Also, the manufacturing process is simplified, leading to a low cost semiconductor device.

Seventh Embodiment

Figure 21:
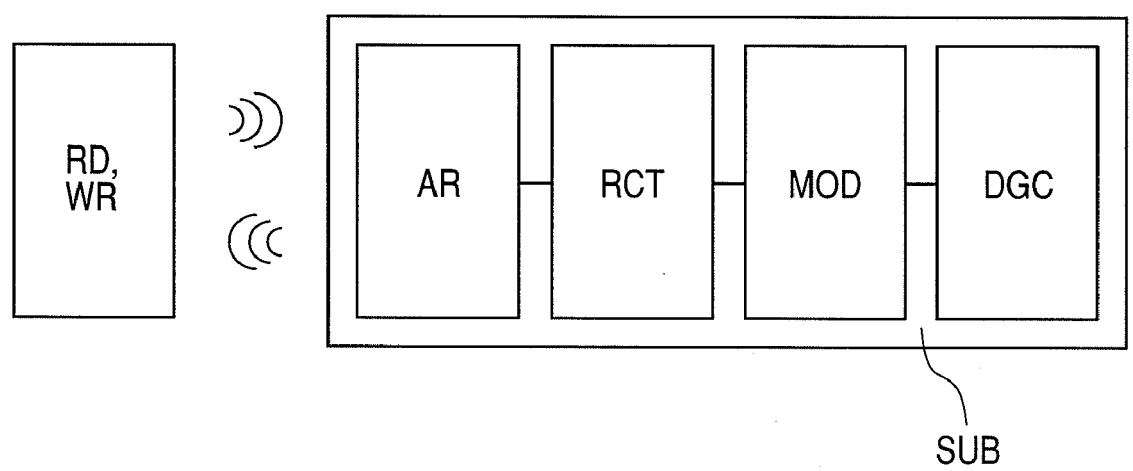
FIG. 21 is a block diagram showing a semiconductor device (radio frequency identification tag) configuration according to a seventh embodiment of the invention.

FIG. 21 shows a radio frequency identification tag configuration according to the seventh embodiment. Oxide TFTs according to any of the first to sixth embodiments are used to constitute an antenna resonant circuit AR, rectifier RCT, modifier MOD and digital circuit DGC to make up a radio frequency identification tag. The tag is designed to communicate with a reader RD and a writer WR. When the tag communicates with the reader RD or writer WR wirelessly, it must operate at high frequencies. The self-aligned oxide TFTs according to the first to sixth embodiments are small in parasitic capacitance, so they can operate at high frequencies. Thus, the circuit which uses self-aligned oxide TFTs according to any of the first to sixth embodiments can operate at high speed. Therefore, the self-aligned oxide TFTs according to the first to sixth embodiments are suitable for use in radio frequency identification tags.

Eighth Embodiment

Figure 22:
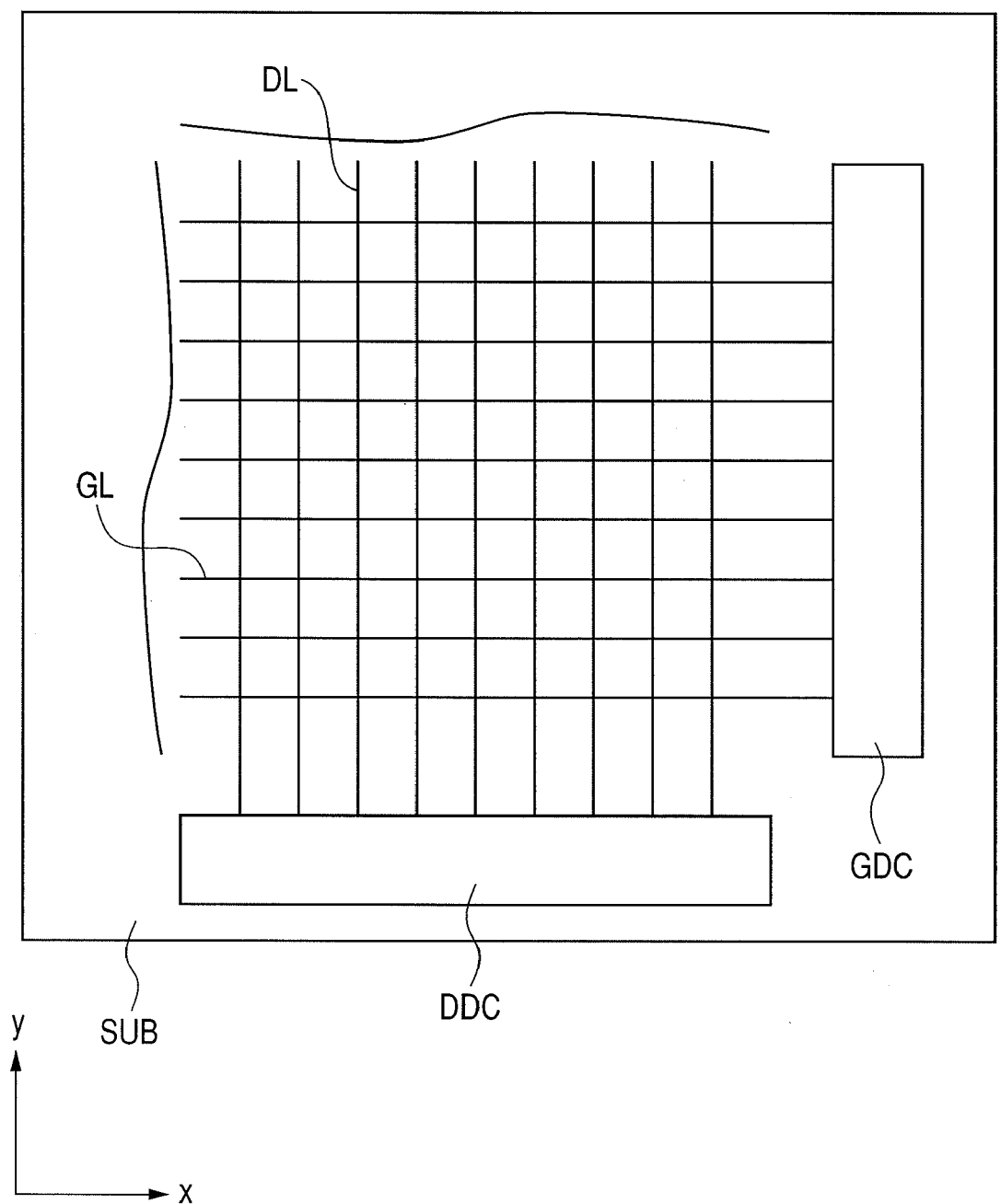
FIG. 22 is a schematic diagram showing a semiconductor device array according to an eighth embodiment of the invention.

FIG. 22 shows a semiconductor device array according to the eighth embodiment. In the eighth embodiment, devices which use oxide TFTs according to any of the first to sixth embodiments are disposed in an array pattern on a substrate SUB. The oxide TFTs according to the first to sixth embodiments may be used not only as transistors for switching or driving the devices in the array but also as transistors which constitute a gate line driving circuit GDC for sending signals to gate lines GL connected with the gate electrodes GE of the oxide TFTs or a data line driving circuit DDC for sending signals to data lines DL connected with the source electrodes SE or drain electrodes DE of the oxide TFTs. In this case, the oxide TFT of each device can be formed concurrently with the TFT in the gate line driving circuit GDC or data line driving circuit DDC.

Figure 23:
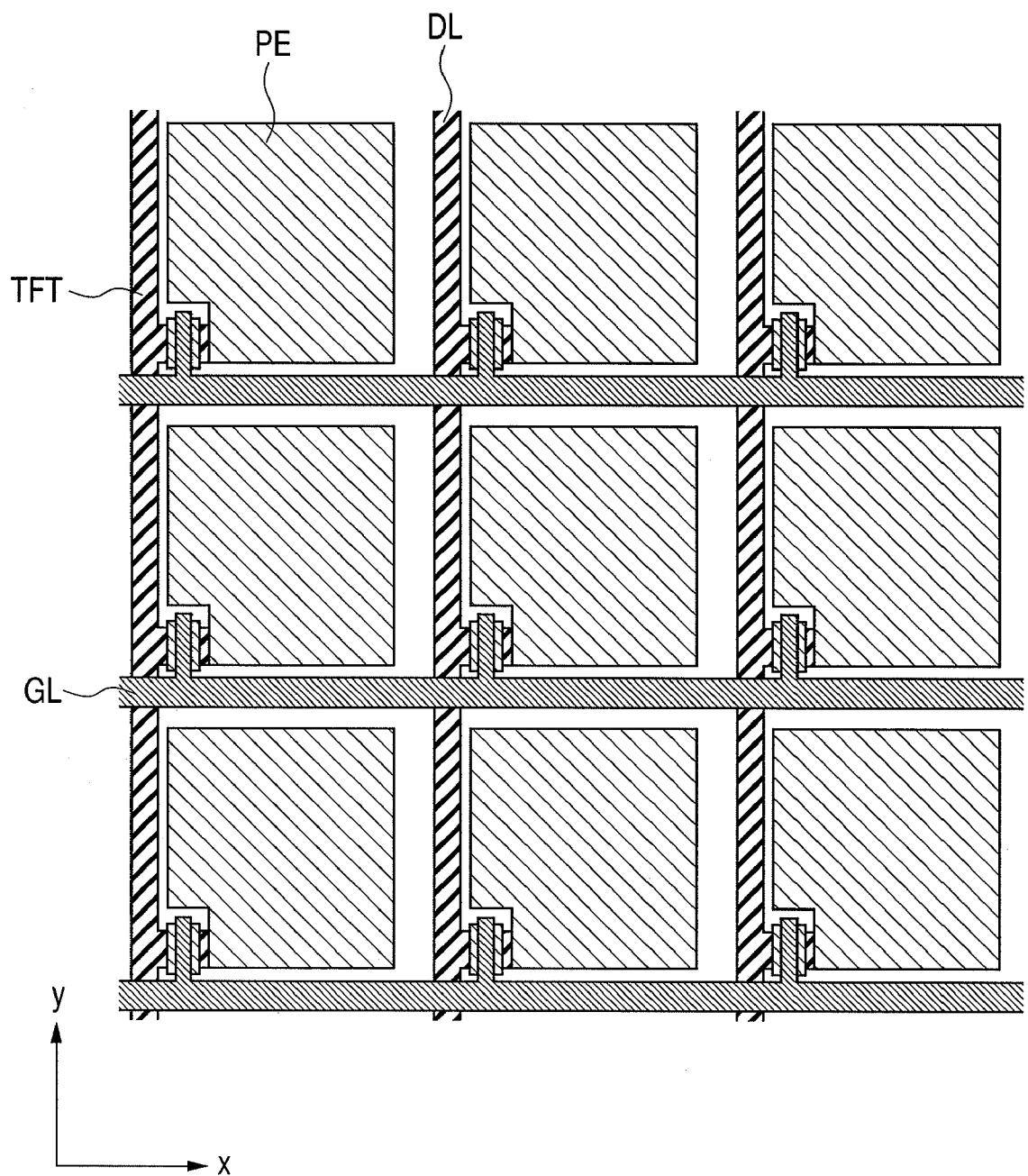
FIG. 23 is a schematic diagram showing a configuration in which the semiconductor device array according to the eighth embodiment is applied to an active matrix liquid crystal display unit.

When the above array is applied to an active matrix liquid crystal display unit, devices may be arranged as shown in FIG. 23. As a scan signal is supplied to a gate line GL extending in the x direction in the figure, an oxide TFT turns on and an image signal from a data line DL extending in the y direction is supplied through the oxide TFT to a pixel electrode PE. Gate lines GL are parallel to each other in the y direction and data lines DL are parallel in the x direction, in which a pixel electrode PE is located in a region (pixel region) surrounded by a pair of neighboring gate lines GL and a pair of neighboring drain lines DL. In this case, the data lines DL are electrically connected with the source electrodes SE and the pixel electrodes PE are electrically connected with the drain electrodes DE. Or the data lines DL may also function as source electrodes SE. This array may also be applied to an organic EL display unit. In that case, oxide TFTs are used as transistors which constitute a pixel circuit. Furthermore, the array may be applied to a memory unit which uses oxide TFTs as selection transistors.

The invention made by the present inventors has been so far explained in reference to the preferred embodiments thereof. However, the invention is not limited thereto and it is obvious that these details may be modified in various ways without departing from the spirit and scope of the invention.

The semiconductor device according to the present invention may be used for a transistor in a radio frequency identification tag or memory element array or peripheral circuit. It may also be used for a transistor for driving a pixel in a transmission, reflection or semi-transmissive liquid crystal display unit or organic EL display unit, or a peripheral circuit.

What is claimed is:

1. A method for manufacturing a semiconductor device, comprising the steps of:
    forming, over a substrate, a source electrode and a drain electrode from a metal film and
    a channel layer from oxide semiconductor;
    forming a gate insulating film over the source electrode, the drain electrode, and the channel layer;
    forming a conductive film over the gate insulating film
    coating the conductive film with negative resist;
    exposing the negative resist to light from a back of the substrate using the source electrode and the drain electrode as a mask;
    removing the negative resist except for an exposed part of the negative resist;
    forming a gate electrode by etching the conductive film using the exposed part as an etching mask;
    forming a first interconnect from the metal film on the substrate together with the source electrode and the drain electrode;
    exposing the negative resist to light from the back of the substrate using, as a mask, the first interconnect as well as the source electrode and the drain electrode;
    exposing part of the negative resist just above the first interconnect to light from a front side of the substrate through a photo mask;
    removing the negative resist except exposed part of the negative resist; and
    forming a second interconnect together with the age electrode by etching the conductive film using the exposed part as an etching mask.

2. The method for manufacturing a semiconductor device according to claim 1, further comprising:
    forming a third interconnect in an area of division of the second interconnect just above the first interconnect to connect the area.

3. The method for manufacturing a semiconductor device according to claim 1, wherein i rays of a mercury lamp are used as a light source for the back exposure.

4. The method for manufacturing a semiconductor device according to claim 1, wherein the substrate is a plastic film.

5. The method for manufacturing a semiconductor device according to claim 1, wherein the channel layer is made of Zn—O, In—O, Ga—O, Sn—O, In—Ga—Zn—O, Zn—Sn—O, In—Sn—O, In—Zn—O, Ga—Zn—O or In—Ga—O.

6. The method for manufacturing a semiconductor device according to claim 1, wherein the gate insulating film is made of Si—O, Al—O or Si—N.

7. The method for manufacturing a semiconductor device according to claim 1, wherein the conductive film is made of In—Sn—O, Al—Zn—O, or Sn—O.

8. The method for manufacturing a semiconductor device according to claim 1,
    wherein the substrate, the channel layer, the gate insulating film, and the conductive film are transparent; and
    wherein the metal film is opaque.

9. A method for manufacturing a semiconductor device, comprising the steps of:
    forming a gate electrode from a metal film over a substrate;
    forming a gate insulating film over the gate electrode and the substrate;
    forming a channel layer from oxide semiconductor over the gate insulating film;
    forming a conductive film over the channel layer;
    coating the conductive film with negative resist;
    exposing the negative resist to light from a back of the substrate using the gate electrode as a mask;
    removing the negative resist except for an exposed part of the negative resist; and
    forming a source electrode and a drain electrode by etching the conductive film using the exposed part as an etching mask;
    forming a first interconnect from the metal film on the substrate together with the gate electrode;
    exposing the negative resist to light from the back of the substrate using, as a mask, the first interconnect as well as the gate electrode;
    exposing part of the negative resist just above the first interconnect to light from a front side of the substrate through a photo mask;
    removing the negative resist except exposed part of the negative resist; and
    forming a second interconnect together with the source electrode and the drain electrode by etching the conductive film using the exposed part as an etching mask.

10. The method for manufacturing a semiconductor device according to claim 9, further comprising:
    forming a third interconnect in an area of division of the second interconnect just above the first interconnect to connect the area.

11. The method for manufacturing a semiconductor device according to claim 9, wherein i rays of a mercury lamp are used as a light source for the back exposure.

12. The method for manufacturing a semiconductor device according to claim 9, wherein the substrate is a plastic film.

13. The method for manufacturing a semiconductor device according to claim 9, wherein the channel layer is made of Zn—O, In—O, Ga—O, Sn—O, In—Ga—Zn—O, Zn—Sn—O, In—Sn—O, In—Zn—O, Ga—Zn—O or In—Ga—O.

14. The method for manufacturing a semiconductor device according to claim 9, wherein the gate insulating film is made of Si—O, Al—O or Si—N.

15. The method for manufacturing a semiconductor device according to claim 9, wherein the conductive film is made of In—Sn—O, Al—Zn—O, or Sn—O.

16. The method for manufacturing a semiconductor device according to claim 9,
    wherein the substrate, the channel layer, the gate insulating film, and the conductive film are transparent; and
    wherein the metal film is opaque.

17. A semiconductor device manufactured by:
    forming, over a substrate, a source electrode and a drain electrode from a metal film and a channel layer from oxide semiconductor;
    forming a gate insulating film over the source electrode, the drain electrode, and the channel layer;
    forming a conductive film over the gate insulating film;
    coating the conductive film with negative resist;
    exposing the negative resist to light from a back of the substrate using the source electrode and the drain electrode as a mask;

removing the negative resist except for an exposed part of the negative resist;

forming a gate electrode by etching the conductive film using the exposed part as an etching mask;

forming a first interconnect from the metal film on the substrate together with the source electrode and the drain electrode;

exposing the negative resist to light from the back of the substrate using, as a mask, the first interconnect as well as the source electrode and the drain electrode;

exposing part of the negative resist just above the first interconnect to light from a front side of the substrate through a photo mask;

removing the negative resist except exposed part of the negative resist; and forming a second interconnect together with the gate electrode by etching the conductive film using the exposed part as an etching mask.

* * * * *